(12) United States Patent
Lee et al.

(10) Patent No.: US 12,100,736 B2
(45) Date of Patent: Sep. 24, 2024

(54) SEMICONDUCTOR DEVICE HAVING CHANNEL LAYERS SPACED APART IN VERTICAL DIRECTION

(71) Applicant: Samsung Electronics Co., Ltd., Suwon-si (KR)

(72) Inventors: Chanhyeong Lee, Seoul (KR); Sangyong Kim, Suwon-si (KR); Jaejung Kim, Suwon-si (KR); Byounghoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 17/513,262

(22) Filed: Oct. 28, 2021

(65) Prior Publication Data

US 2022/0238653 A1    Jul. 28, 2022

(30) Foreign Application Priority Data

Jan. 26, 2021    (KR) .......................... 10-2021-0010935

(51) Int. Cl.
*H01L 29/10*    (2006.01)
*H01L 29/08*    (2006.01)

(52) U.S. Cl.
CPC ...... *H01L 29/1033* (2013.01); *H01L 29/0847* (2013.01)

(58) Field of Classification Search
CPC ......... H01L 29/78696; H01L 29/42392; H01L 29/1033; H01L 29/0847; H01L 21/823462; H01L 29/165; H01L 29/41766; H01L 29/0673; H01L 29/66439; H01L 21/823412; H01L 21/823437

See application file for complete search history.

(56) References Cited

U.S. PATENT DOCUMENTS

| | | | |
|---|---|---|---|
| 10,269,920 B2 | 4/2019 | Cheng et al. | |
| 10,559,566 B1 | 2/2020 | Lee et al. | |
| 10,700,064 B1 | 6/2020 | Zhang et al. | |
| 10,734,286 B1 | 8/2020 | Ando et al. | |
| 2002/0149031 A1 | 10/2002 | Kim et al. | |
| 2020/0258785 A1 | 8/2020 | Zhang et al. | |
| 2021/0066100 A1* | 3/2021 | Liaw ..................... | H01L 29/785 |

FOREIGN PATENT DOCUMENTS

KR    1020020078996 A    10/2002

* cited by examiner

*Primary Examiner* — Changhyun Yi
(74) *Attorney, Agent, or Firm* — Muir Patent Law, PLLC

(57) ABSTRACT

A semiconductor device includes a first active region on a substrate, channel layers disposed on the first active region to be spaced apart from each other in a vertical direction, a first gate structure disposed on the first active region and surrounding each channel layer, and a first source/drain region on the first active region on at least one side of the first gate structure. The channel layers include first to third channel layers. The first gate structure includes a first gate electrode and a first gate dielectric layer. The first gate dielectric layer includes first to third portions surrounding the first to third channel layers, respectively. The second portion has a thickness greater than a thickness of the first portion, and the third portion has a thickness greater than the thickness of the second portion.

20 Claims, 25 Drawing Sheets

SEMICONDUCTOR DEVICE HAVING CHANNEL LAYERS SPACED APART IN VERTICAL DIRECTION

CROSS-REFERENCE TO RELATED APPLICATION(S)

This application claims the benefit under 35 USC 119(a) of Korean Patent Application No. 10-2021-0010935 filed on Jan. 26, 2021 in the Korean Intellectual Property Office, the entire disclosures of which are incorporated herein by reference for all purposes.

BACKGROUND

The present inventive concept relates to a semiconductor device.

In accordance with an increase in demand for a semiconductor device having high performance, a high speed, and/or multifunctionality, a degree of integration of the semiconductor device has increased. To meet such a high degree of integration of the semiconductor device, it is desirable to implement patterns having a fine width or a fine spaced distance. Efforts to develop a semiconductor device including a FinFET including a channel having a three-dimensional structure in order to overcome a limitation of operating characteristics due to a reduction in a size of a planar metal oxide semiconductor field effect transistor (MOSFET) have been made.

SUMMARY

Example embodiments provide a semiconductor device having improved electrical characteristics.

According to example embodiments, a semiconductor device includes a first active region extending on a substrate in a first direction, a first channel structure including a plurality of channel layers disposed on the first active region to be spaced apart from each other in a vertical direction perpendicular to an upper surface of the substrate, a first gate structure disposed on the first active region, the first gate structure extending on the substrate in a second direction different from the first direction, and surrounding each of the plurality of channel layers of the first channel structure, and a first source/drain region disposed on the first active region on at least one side of the first gate structure and in contact with each of the plurality of channel layers. The plurality of channel layers of the first channel structure include a first channel layer, a second channel layer on the first channel layer, and a third channel layer on the second channel layer. The first gate structure includes a first gate electrode and a first gate dielectric layer. The first gate dielectric layer includes a first portion surrounding the first channel layer, a second portion surrounding the second channel layer, and a third portion surrounding the third channel layer. The second portion has a thickness greater than a thickness of the first portion, and the third portion has a thickness greater than the thickness of the second portion.

According to example embodiments, a semiconductor device includes an active region extending on a substrate in a first direction, a plurality of channel layers disposed on the active region to be spaced apart from each other in a direction perpendicular to an upper surface of the substrate, a plurality of gate structures disposed on the active region and spaced apart from each other in the first direction, the plurality of gate structures extending in a second direction on the substrate and including a first gate structure surrounding each of the plurality of channel layers, and a source/drain region disposed on the active region on at least one side of the gate structures and in contact with the plurality of channel layers. The plurality of channel layers include a first channel layer, a second channel layer on the first channel layer, and a third channel layer on the second channel layer. The first gate structure includes a gate electrode and a gate dielectric layer. The gate dielectric layer includes a first portion surrounding the first channel layer, a second portion surrounding the second channel layer, a third portion surrounding the third channel layer, and a fourth portion disposed between the active region and the gate electrode. The first to fourth portions of the gate dielectric layer have different thicknesses from each other. The third portion of the gate dielectric layer has the greatest thickness among the first to fourth portions of the gate dielectric layer.

According to example embodiments, a semiconductor device includes an active region extending on a substrate in a first direction, a plurality of channel layers disposed on the active region to be spaced apart from each other in a direction perpendicular to an upper surface of the substrate, a plurality of gate structures disposed on the active region and spaced apart from each other in the first direction, the plurlaity of gate structures extending in a second direction on the substrate and including a first gate structure surrounding each of the plurality of channel layers, and a source/drain region disposed on the active region on at least one side of the gate structures and in contact with the plurality of channel layers. The plurality of channel layers include a first channel layer, a second channel layer on the first channel layer, and a third channel layer on the second channel layer. The first gate structure includes a gate electrode and a gate dielectric layer. The gate dielectric layer includes a first portion surrounding the first channel layer, a second portion surrounding the second channel layer, a third portion surrounding the third channel layer, and a fourth portion disposed between the active region and the gate electrode. The fourth portion of the gate dielectric layer has the smallest thickness among the first to fourth portions of the gate dielectric layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
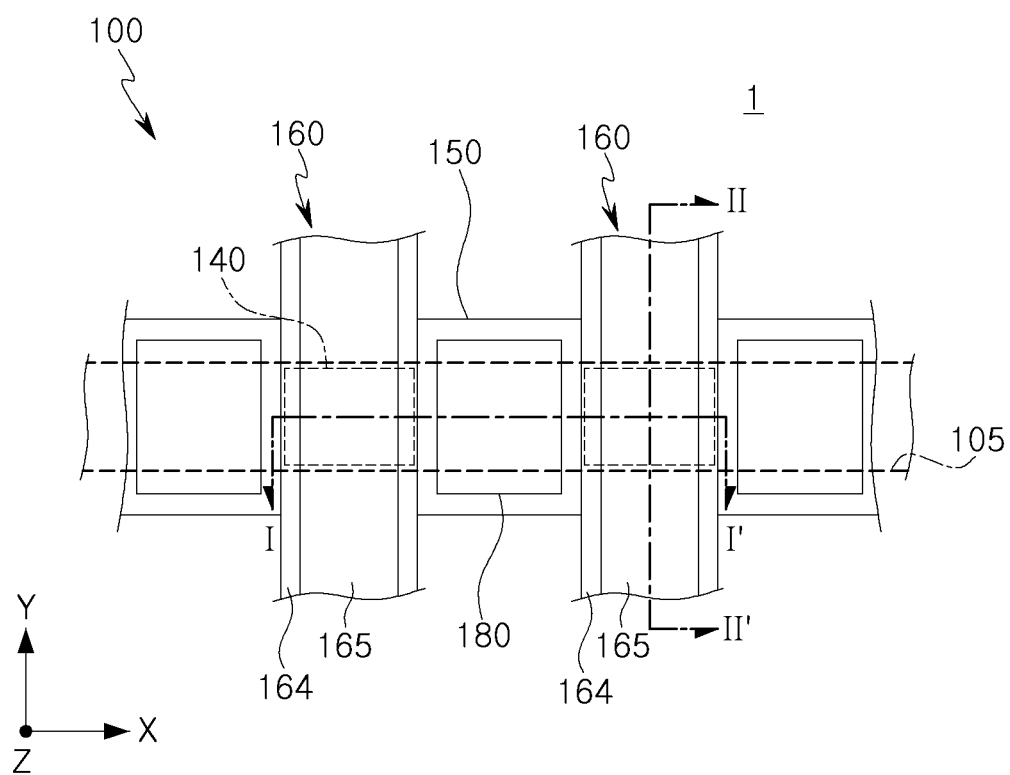
FIG. 1 is a plan view illustrating a semiconductor device according to example embodiments.

FIG. 1 is a plan view illustrating a semiconductor device according to example embodiments.

Figure 2:
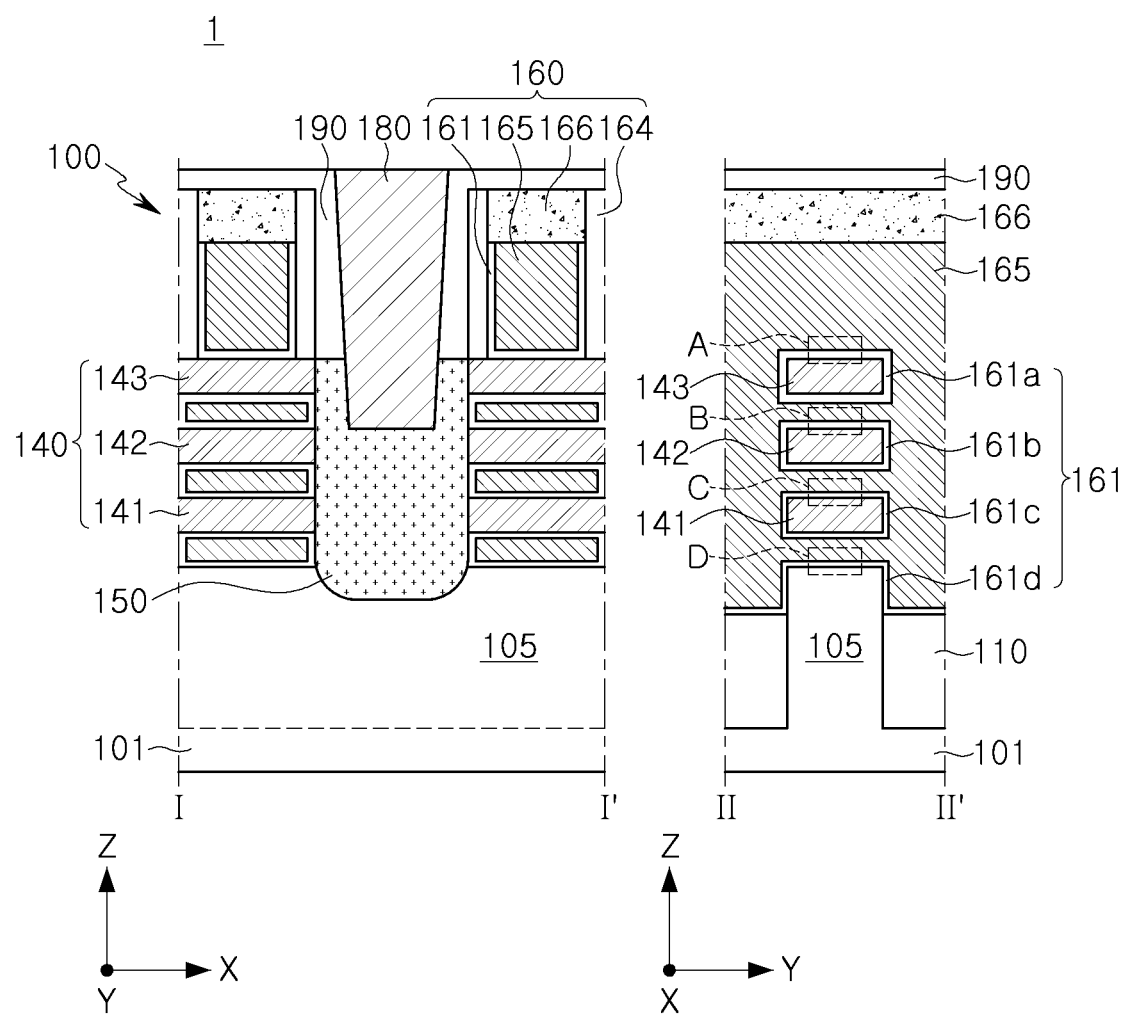
FIG. 2 is a cross-sectional view illustrating the semiconductor device according to example embodiments.

FIG. 2 is a cross-sectional view illustrating the semiconductor device according to example embodiments. FIG. 2 illustrates cross sections of the semiconductor device of FIG. 1 taken along lines I-I' and II-II'. For convenience of description, only main components of the semiconductor device are illustrated in FIGS. 1 and 2.

Figure 3:
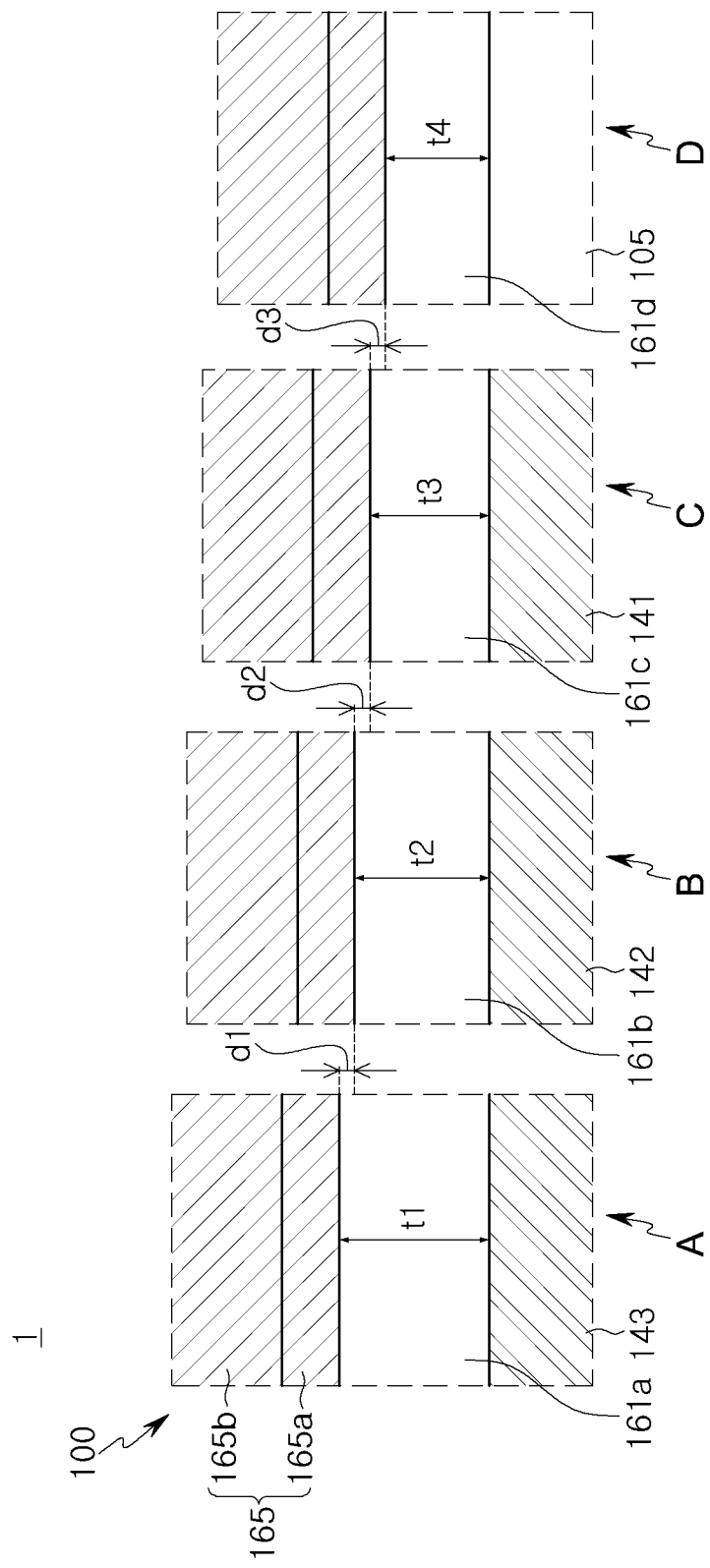
FIG. 3 is a partially enlarged view illustrating a portion of the semiconductor device according to example embodiments.

FIG. 3 is a partially enlarged view illustrating a portion of the semiconductor device according to example embodiments. FIG. 3 is an enlarged view of each of regions A, B, C, and D of FIG. 2.

Referring to FIGS. 1 to 3, a semiconductor device 1 may include a substrate 101, and a first transistor 100 including a first active region 105 on the substrate 101, a first channel structure 140 including a plurality of channel layers 141, 142, and 143 disposed on the first active region 105 to be vertically spaced apart from each other, first source/drain regions 150 in contact with the plurality of channel layers 141, 142, and 143 of the first channel structure 140, and first gate structures 160 intersecting the first active region 105 and extending. The semiconductor device 1 may further include first isolation layers 110, a first interlayer insulating layer 190, and first contact structures 180 connected to the first source/drain regions 150. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

In the semiconductor device 1, the first active region 105 may have a fin structure, and a first gate electrode 165 of the first gate structure 160 may be disposed between the first active region 105 and the first channel structure 140, between the plurality of channel layers 141, 142, and 143 of the first channel structure 140, and above the first channel structure 140. Therefore, the semiconductor device 1 may include a multi-bridge-channel field-effect transistor (MBCFET™) formed by the first channel structure 140, the first source/drain regions 150, and the first gate electrode 165.

However, the semiconductor device according to example embodiments is not limited thereto, and may include, for example, a FinFET, which is a transistor in which a first active region 105 has a fin structure and a channel region is formed in the first active region 105 intersecting the first gate electrode 165.

The substrate 101 may have an upper surface extending in an X direction and a Y direction. The substrate 101 may include a semiconductor material such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may also be provided as a bulk wafer, an epitaxial layer, a silicon on insulator (SOI) layer, a semiconductor on insulator (SeOI) layer, or the like.

The first active region 105 may be defined by the first isolation layer 110 in the substrate 101 and may be disposed to extend in a first direction, for example, the X direction. The first active region 105 may have a structure in which it protrudes from the substrate 101. An upper end of the first active region 105 may be disposed to protrude from an upper surface of the first isolation layer 110 by a predetermined height. The first active region 105 may be formed as a portion of the substrate 101 or may include an epitaxial layer grown from the substrate 101. However, at opposite sides of the first gate structure 160, the first active regions 105 on the substrate 101 may be partially recessed, and the first source/drain regions 150 may be disposed on the recessed first active regions 105. Therefore, as illustrated in FIG. 2, the first active region 105 may have a relatively high height below the first channel structure 140 and the first gate structure 160. According to example embodiments, the first active region 105 may include impurities, and at least some of the first active regions 105 may include different conductivity-type impurities, but are not limited thereto. A plurality of first active regions 105 may be disposed to be spaced apart from each other in the Y direction.

The first isolation layer 110 may define the first active region 105 in the substrate 101. The first isolation layer 110 may be formed by, for example, a shallow trench isolation (STI) process. The first isolation layer 110 may expose upper sidewalls of the first active region 105. According to example embodiments, the first isolation layer 110 may include a region that extends deeper to a lower portion of the substrate 101 between the first active regions 105. The first isolation layer 110 may have a curved upper surface having a higher level as it becomes more adjacent to the first active region 105, but a shape of the upper surface of the first isolation layer 110 is not limited thereto. The first isolation layer 110 may be formed of an insulating material. The first isolation layer 110 may be formed of, for example, oxide, nitride, or a combination thereof.

The first channel structure 140 may include a first channel layer 141, a second channel layer 142 on the first channel layer 141, and a third channel layer 143 on the second channel layer 142, which are two or more channel layers disposed on the first active region 105 to be spaced apart from each other in a direction perpendicular to an upper surface of the first active region 105, for example, in a z direction. The first to third channel layers 141, 142, and 143 may be connected to the first source/drain region 150 and be spaced apart from the upper surface of the first active region 105. The first channel layer 141 may be disposed at a lower height level than the second channel layer 142. The second channel layer 142 may be disposed at a lower height level than the third chnnel layer 143.

The first to third channel layers 141, 142, and 143 may have a width that is the same as or similar to that of the first active region 105 in the Y direction, and may have a width that is the same as or similar to that of the first gate structure 160 in the X direction. However, according to example embodiments, the first to third channel layers 141, 142, and 143 may have a reduced width so that side surfaces thereof are positioned below the first gate structure 160 in the X direction.

The first to third channel layers 141, 142, and 143 may be formed of a semiconductor material, and may include at least one of, for example, silicon (Si), silicon germanium (SiGe), and germanium (Ge). The first to third channel layers 141, 142, and 143 may be formed of the same material as the substrate 101, for example. The number and shapes of channel layers 141, 142, and 143 constituting one first channel structure 140 may be variously modified in example embodiments.

The first source/drain regions 150 may be disposed on the first active region 105 on opposite sides of the first channel structure 140. The first source/drain regions 150 may be provided as a source region or a drain region of a transistor. The first source/drain region 150 may be disposed to cover a side surface of each of the first to third channel layers 141, 142, and 143 of the first channel structure 140 and cover the upper surface of the first active region 105 at a lower end of the first source/drain region 150. The first source/drain region 150 may be disposed to partially recess an upper portion of the first active region 105, but in example embodiments, whether or not to recess the upper portion of the first active region 105 and a depth at which the upper portion of the first active region 105 is recessed may be variously modified. The first source/drain regions 150 may be a semiconductor layer including silicon (Si) and may be formed of an epitaxial layer. In an example embodiment, the first source/drain regions 150 may include a first conductivity-type semiconductor layer including a first dopant. The first source/drain regions 150 may include different types and/or concentrations of impurities. For example, the first source/drain regions 150 may include n-type doped silicon (Si) and/or p-type doped silicon germanium (SiGe). In an example embodiment, the first source/drain regions 150 may have a merged shape in which they are connected to each other between the first active regions 105 adjacent to each other in the Y direction, but are not limited thereto.

The first gate structure 160 may be disposed to intersect with the first active region 105 and the first channel structures 140 above the first active region 105 and the first channel structures 140 and extend in one direction, for example, the Y direction. Channel regions of transistors may be formed in the first active region 105 and the first channel structures 140 intersecting the first gate structure 160. The first gate structure 160 may include a first gate electrode 165, a first gate dielectric layer 161, spacer layers 164 on side surfaces of the first gate electrode 165, and a gate capping layer 166 on an upper surface of the first gate electrode 165.

The first gate dielectric layer 161 may be disposed between the first active region 105 and the first gate electrode 165 and between the first channel structure 140 and the first gate electrode 165, and may be disposed to cover at least some of surfaces of the first gate electrode 165. For example, the first gate dielectric layer 161 may be disposed to surround all surfaces of the first gate electrode 165 except for a top surface of the first gate electrode 165. The first gate dielectric layer 161 may extend between the first gate electrode 165 and the spacer layers 164, but is not limited thereto.

As illustrated in FIGS. 2 and 3, the first gate dielectric layer 161 may include first to third portions 161c, 161b, and 161a disposed between each of the plurality of channel layers 141, 142, and 143 and the first gate electrode 165, and a fourth portion 161d disposed between the first active region 105 and the first gate electrode 165.

In a cross section (see a right diagram of FIG. 2) in the Y direction, the first gate dielectric layer 161 may include the first portion 161c surrounding the first channel layer 141, the second portion 161b surrounding the second channel layer 142, and the third portion 161a surrounding the third channel layer 143. For example, the first to third portions 161c, 161b, and 161a may be formed to surround surfaces of the first to third channel layers 141, 142, and 143 in the Y direction, respectively.

In an example embodiment, the first gate dielectric layer 161 may have a thickness that becomes greater as it becomes more distant from the substrate 101 in a direction perpendicular to the upper surface of the substrate 101. In an example embodiment, in the first gate dielectric layer 161, the first to third portions 161c, 161b, and 161a that surround the plurality of channel layers 141, 142, and 143, respectively, may have thicknesses that become gradually greater as they become more distant from the substrate 101 in the direction perpendicular to the upper surface of the substrate 101. The first gate dielectric layer 161 may have a maximum thickness at a portion disposed most adjacent to the first gate capping layer 166.

The first gate dielectric layer 161 having the thickness that becomes greater as it becomes more distant from the substrate 101 may be formed by a process of inducing regrowth of oxide included in the first gate dielectric layer 161, as described later with reference to FIGS. 19A and 19B. The process of inducing the regrowth of the oxide may be, for example, a wet etching process or an ozone ($O_3$) treatment process.

In an example embodiment, the fourth portion 161d of the first gate dielectric layer 161 may have the smallest thickness among the first to fourth portions 161c, 161b, 161a, and 161d of the first gate dielectric layer 161. In an example embodiment, a thickness t4 of the fourth portion 161d may be smaller than a thickness t3 of the first portion 161c. In an example embodiment, the thickness t4 of the fourth portion 161d may be smaller than a thickness t2 of the second portion 161b. In an example embodiment, the thickness t4 of the fourth portion 161d may be smaller than a thickness t1 of the third portion 161a. In the present specification, a thickness may refer to a maximum thickness or an average thickness of each component. In an example embodiment, a difference d3 between the thickness t4 of the fourth portion 161d and the thickness t3 of the third portion 161c may be in the range of from about 1 Å to about 3 Å. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The thickness t3 of the first portion 161c may be greater than the thickness t4 of the fourth portion 161d. The thickness t3 of the first portion 161c may be smaller than the thickness t2 of the second portion 161b and/or the thickness t1 of the third portion 161a. In an example embodiment, a difference d2 between the thickness t3 of the first portion 161c and the thickness t2 of the second portion 161b may be in the range of about 1 Å to about 3 Å.

The thickness t2 of the second portion 161b may be greater than the thickness t3 of the first portion 161c and the thickness t4 of the fourth portion 161d. The thickness t2 of the second portion 161b may be smaller than the thickness t1 of the third portion 161a. In an example embodiment, a difference d1 between the thickness t2 of the second portion 161b and the thickness t1 of the third portion 161a may be in the range of from about 1 Å to about 3 Å.

The thickness t1 of the third portion 161a may be greater than the thickness t2 of the second portion 161b, the thickness t3 of the first portion 161c, and the thickness t4 of the fourth portion 161d. In an example embodiment, the third portion 161a may have the greatest thickness among the fourth portion 161d and the first to third portions 161c, 161b, and 161a. In an example embodiment, the difference between the thickness t2 of the second portion 161b and the thickness t1 of the third portion 161a may be in the range of from about 1 Å to about 3 Å. In an example embodiment, a difference between the thickness t3 of the first portion 161c and the thickness t1 of the third portion 161a may be in the range of from about 2 Å to about 6 Å.

The first gate dielectric layer disposed relatively more distant from the substrate 101 may be to have a thickness greater than that of the first gate dielectric layer disposed relatively closer to the substrate 101 to reduce a difference in performance between the plurality of channel layers 141, 142, and 143 due to damage applied to the first gate dielectric layer in a subsequent process. For example, a process influence applied to the third portion 161c disposed at the uppermost portion among the first to third portions 161c, 161b, and 161a of the first gate dielectric layer 161 is greater, and thus, the third portion 161c may be formed to have the greatest thickness to reduce differences in performance among the plurality of channel layers 141, 142, and 143. According to example embodiments, the differences in performance among the plurality of channel layers 141, 142, and 143 may be reduced to improve electrical characteristics of the semiconductor device 1.

The first gate dielectric layer 161 may include oxide, nitride, or a high-k material (i.e., a high-k dielectric material). The high-k material may refer to a dielectric material having a dielectric constant higher than that of a silicon oxide film ($SiO_2$).

The first gate electrode 165 may be disposed to fill spaces between the plurality of channel layers 141, 142, and 143 above the first active region 105 and extend above the first channel structure 140. The first gate electrode 165 may be spaced apart from the plurality of channel layers 141, 142, and 143 by the first gate dielectric layer 161. Distances between the first gate electrode 165 and each of the plurality of channel layers 141, 142, and 143 may be different from each other.

The first gate electrode 165 may include a conductive material, and may include, for example, a metal nitride such as titanium nitride (TiN), tantalum nitride (TaN), or tungsten nitride (WN), a metal material such as aluminum (Al), tungsten (W), or molybdenum (Mo), or a semiconductor material such as doped polysilicon.

In an example embodiment, the first gate electrode 165 may include two or more layers, that is, multiple layers, as illustrated in FIG. 3. In an example embodiment, the first gate electrode 165 may include a first conductive layer 165a disposed on the first gate dielectric layer 161 and a second conductive layer 165b disposed on the first conductive layer 165a. The first conductive layer 165a may be referred to as a first work function control pattern. In an example embodiment, the first conductive layer 165a and the second conductive layer 165b may include different conductive materials. In an example embodiment, the first conductive layer 165a may be a plurality of layers including different conductive materials.

The first spacer layers 164 may be disposed on both side surfaces of the first gate electrode 165 and may extend in the z direction perpendicular to the upper surface of the substrate 101. In an example embodiment, each of the first spacer layers 164 may include a portion where an outer side surface thereof is a curved surface so that a width of an upper portion thereof is smaller than a width of a lower portion thereof. The first spacer layers 164 may insulate the first source/drain regions 150 and the first gate electrodes 165 from each other. The first spacer layers 164 may have a multilayer structure according to example embodiments. The first spacer layers 164 may be formed of oxide, nitride, and oxynitride, and in particular, may be formed of a low-k film.

The first gate capping layer 166 may be disposed on the first gate electrode 165. The first gate capping layer 166 may be disposed to extend in a second direction, for example, the Y direction along the upper surface of the first gate electrode 165. Side surfaces of the first gate capping layer 166 may be surrounded by the first spacer layers 164. An upper surface of the first gate capping layer 166 may be substantially coplanar with upper surfaces of the first spacer layers 164, but is not limited thereto. The first gate capping layer 166 may be formed of oxide, nitride, and oxynitride, and specifically, may include at least one of SiO, SiN, SiCN, SiOC, SiON, and SiOCN. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first contact structure 180 may penetrate through the first interlayer insulating layer 190 and be then connected to the first source/drain regions 150, and may apply an electrical signal to the first source/drain regions 150. The first contact structure 180 may have an inclined side surface so that a width of a lower portion thereof becomes narrower than a width of an upper portion thereof according to an aspect ratio, but is not limited thereto. The first contact structure 180 may extend from above, for example, to a level below the third channel layer 143. For example, the first contact structure 180 may extend to a height corresponding to an upper surface of the second channel layer 142. However, in example embodiments, the first contact structure 180 may be disposed to be in contact with the first source/drain regions 150 along upper surfaces of the first source/drain regions 150 without recessing the first source/drain regions 150. The first contact structure 180 may include, for example, a metal nitride such as titanium nitride (TiN), tantalum nitride (TaN), or tungsten nitride (WN) and/or a metal material such as aluminum (Al), tungsten (W), or molybdenum (Mo). In example embodiments, the first contact structure 180 may further include a barrier metal layer disposed along an outer side surface thereof and/or a metal-semiconductor compound layer disposed in a region in contact with the first source/drain regions 150. The metal-semiconductor compound layer may be, for example, a metal silicide layer.

The first interlayer insulating layer 190 may be disposed to cover the first source/drain regions 150 and the first gate structures 160 and cover the first isolation layer 110. The first interlayer insulating layer 190 may include at least one of oxide, nitride, and oxynitride, and may include, for example, a low-k material.

The same description as that described above with reference to FIGS. 1 to 3 will hereinafter be omitted.

Figure 4A:
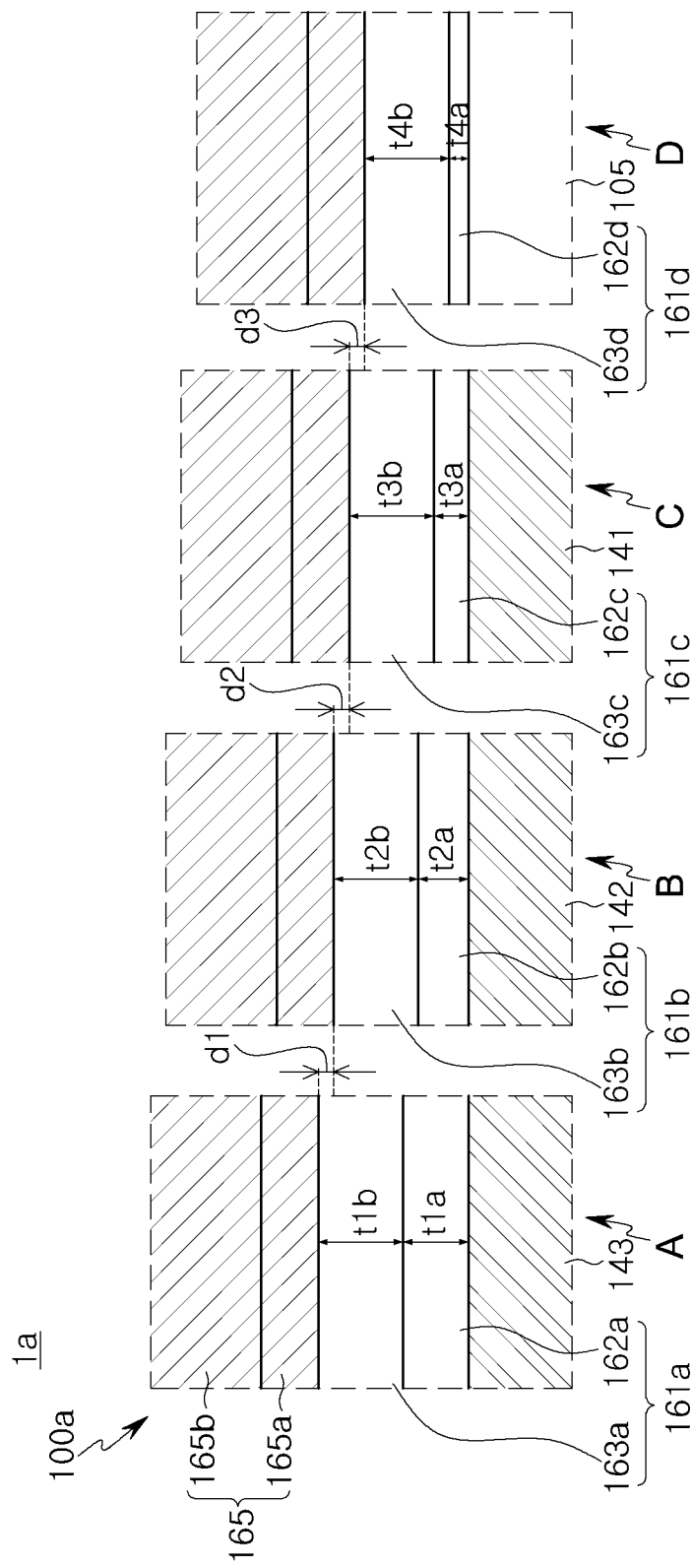
FIGS. 4A, 4B, and 4C are partially enlarged views illustrating portions of semiconductor devices according to example embodiments.
Figure 4B:
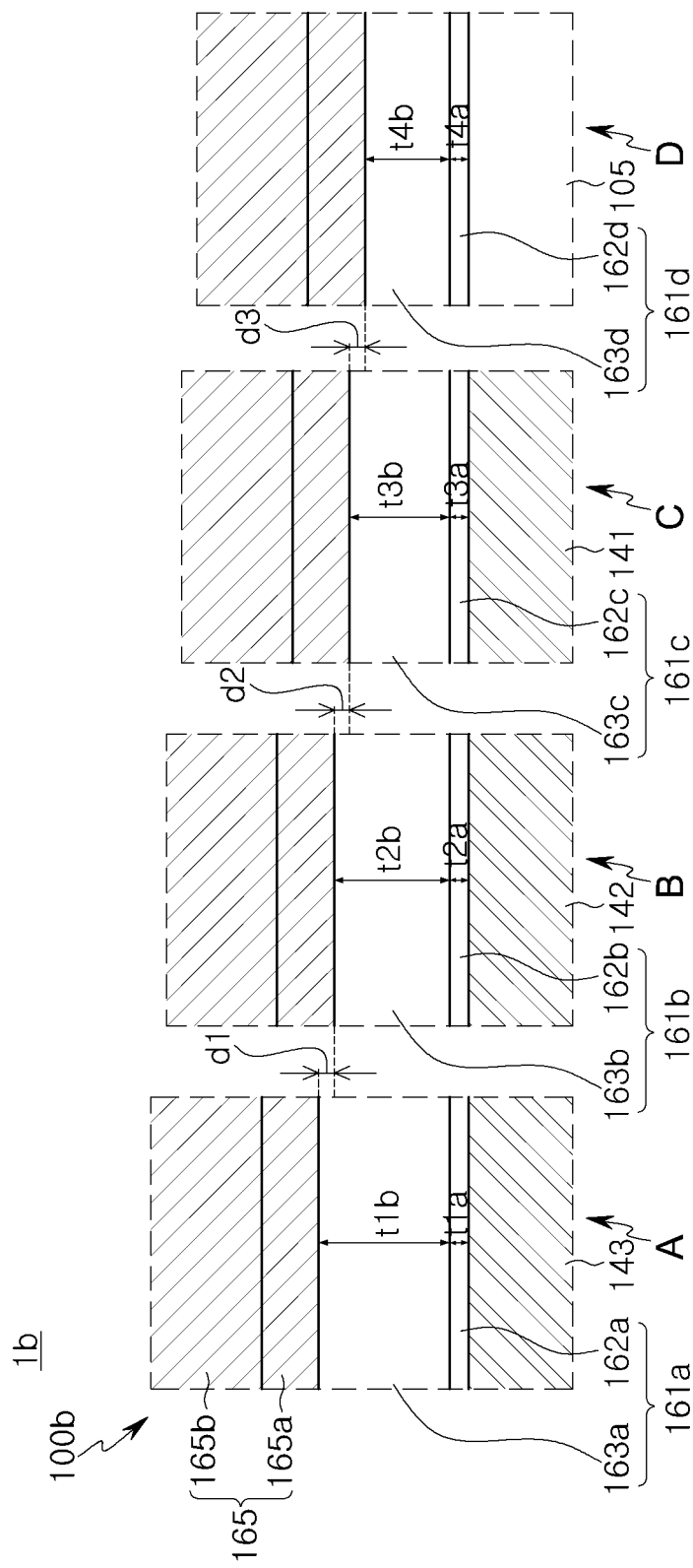
Figure 4C:
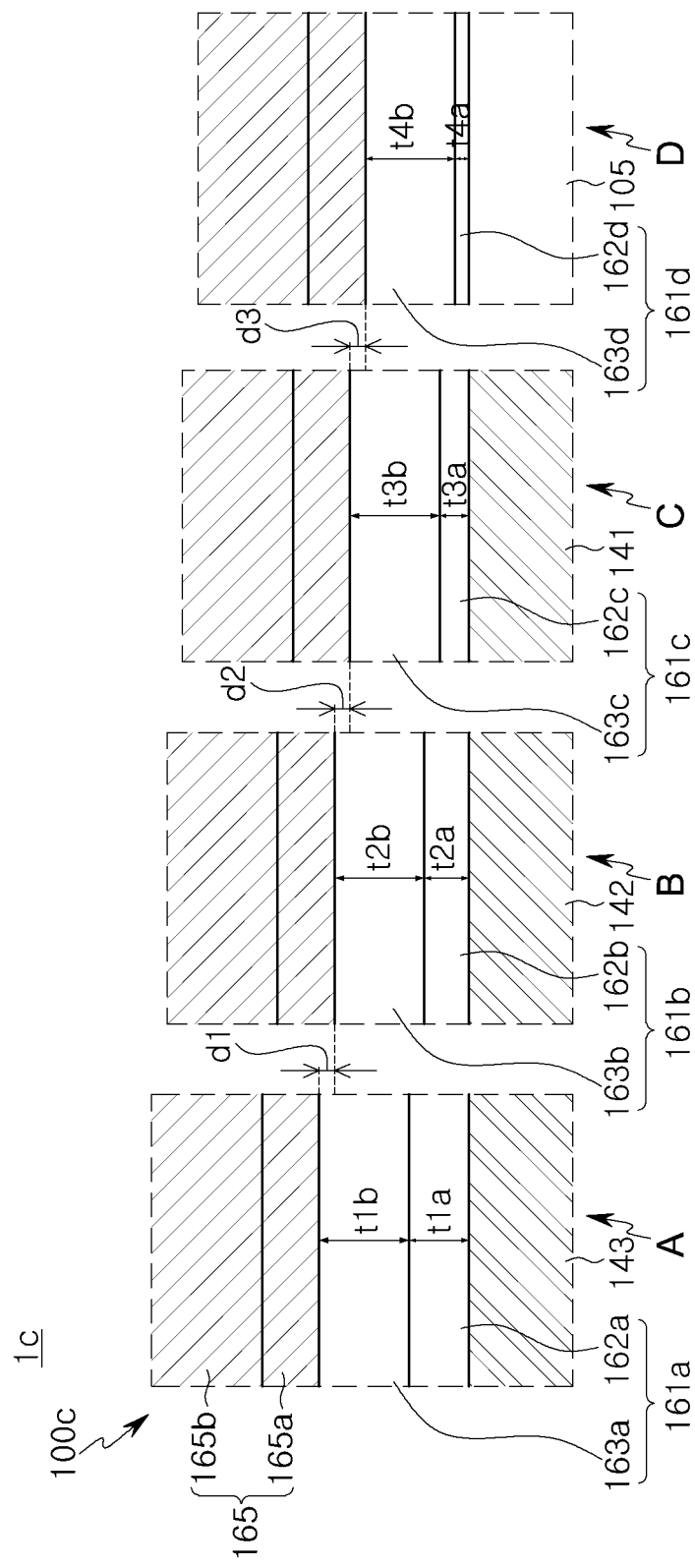

FIGS. 4A to 4C are partially enlarged views illustrating portions of semiconductor devices according to example embodiments. FIGS. 4A to 4C are enlarged views of regions corresponding to regions A, B, C, and D of FIG. 2.

Referring to FIG. 4A, in a first transistor 100a of a semiconductor device 1a, a first gate dielectric layer 161 may include first to fourth portions 161c, 161b, 161a, and 161d having different thicknesses. In an example embodiment, the first gate dielectric layer 161 may be formed as a plurality of layers.

In an example embodiment, the first gate dielectric layer 161 may include interface layers 162a, 162b, 162c, and 162d and high-k layers (i.e., high-k dielectric layers) 163a, 163b, 163c, and 163d that are disposed on the interface layers 162a, 162b, 162c, and 162d, respectively. In an example embodiment, the interface layers 162a, 162b, 162c, and 162d may include a first portion 162c, a second portion 162b, and a third portion 162a that surround the first to third channel layers 141, 142, and 143, respectively, and a fourth portion 162d disposed between the first active region 105 and the first gate electrode 165. In an example embodiment, the high-k layers 163a, 163b, 163c, and 163d may include a first portion 163c of the high-k layer disposed on the first portion 162c of the interface layer, a second portion 163b of the high-k layer disposed on the second portion 162b of the interface layer, a third portion 163a of the high-k layer disposed on the third portion 162a of the interface layer, and a fourth portion 163d of the high-k layer disposed on the fourth portion 162d of the interface layer.

In an example embodiment, thicknesses t1a, t2a, t3a, and t4a of the interface layers 162a, 162b, 162c, and 162d and thicknesses t1b, t2b, t3b, and t4b of the high-k layers 163a, 163b, 163c, and 163d may become greater as these layers become more distant from the substrate 101 in the direction perpendicular to the upper surface of the substrate 101. In an example embodiment, thicknesses t3a, t2a, t1a of the interface layers 162c, 162b, and 162a that surround the first to third portions 161c, 161b, and 161a of the first gate dielectric layer 161, respectively, and thicknesses t3b, t2b, and t1b of the high-k layers 163c, 163b, and 163a disposed on the first to third interface layers 162c, 162b, and 162a, respectively, may become gradually greater as these layers become more distant from the substrate 101 in the direction perpendicular to the upper surface of the substrate 101.

In an example embodiment, the thickness t3a of the first portion 162c of the interface layer may be greater than the thickness t4a of the fourth portion 162d of the interface layer, the thickness t2a of the second portion 162b of the interface layer may be greater than the thickness t3a of the first portion 162c of the interface layer, and the thickness t1a of the third portion 162a of the interface layer may be greater than the thickness t2a of the second portion 162b of the interface layer. For example, a thickness of a portion disposed on a relatively high level in the interface layer may be greater than a thickness of a portion disposed on a relatively low level in the interface layer.

In another example embodiment, the thickness t3a of the first portion 162c and the thickness t2a of the second portion 162b of the interface layer may be substantially the same as each other, and the thickness t1a of the third portion 162a of the interface layer may be greater than the thickness t3a of the first portion 162c and the thickness t2a of the second portion 162b.

In an example embodiment, the thickness t3b of the first portion 163c of the high-k layer may be greater than the thickness t4b of the fourth portion 163d of the high-k layer, the thickness t2b of the second portion 163b of the high-k layer may be greater than the thickness t3b of the first portion 163c of the high-k layer, and the thickness t1b of the third portion 163a of the high-k layer may be greater than the thickness t2b of the second portion 163b of the high-k layer. That is, a thickness of a portion disposed on a relatively high level in the high-k layer may be greater than a thickness of a portion disposed on a relatively low level in the high-k layer.

In another example embodiment, the thickness t3b of the first portion 163c and the thickness t2b of the second portion 163b of the high-k layer may be substantially the same as each other, and the thickness t1b of the third portion 163a of the high-k layer may be greater than the thickness t3b of the first portion 163c and the thickness t2b of the second portion 163b.

The interface layers 162a, 162b, 162c, and 162d may include an insulating material having a first dielectric constant, and the high-k layers 163a, 163b, 163c, and 163d may include an insulating material having a second dielectric constant higher than the first dielectric constant. In an example embodiment, the interface layers 162a, 162b, 162c, and 162d may include silicon oxide ($SiO_2$), and the high-k layers 163a, 163b, 163c, and 163d may include any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

In an example embodiment, the high-k layers 163a, 163b, 163c, and 163d may be formed of a plurality of layers including different high-k dielectric materials. For example, each of the high-k layers may be formed of a high-k dielectric material which is different from the others.

In FIGS. 4B to 4C, the same description as that described with reference to FIG. 4A is omitted.

Referring to FIG. 4B, in a first transistor 100b of a semiconductor device 1b, thicknesses t1a, t2a, t3a, and t4a of interface layers 162a, 162b, 162c, and 162d may be substantially uniform, and thicknesses t1b, t2b, t3b, and t4b of high-k layers 163a, 163b, 163c, and 163d may become greater as the high-k layers 163a, 163b, 163c, and 163d become more distant from the substrate 101 in the direction perpendicular to the upper surface of the substrate 101.

In an example embodiment, a difference between a thickness t3b of a first portion 163c of the high-k layer and a thickness t4b of a fourth portion 163d of the high-k layer may be in the range of from about 1 Å to about 3 Å. In an example embodiment, a difference between a thickness t2b of a second portion 163b of the high-k layer and a thickness t3b of the first portion 163c of the high-k layer may be in the range of from about 1 Å to about 3 Å. In an example embodiment, a difference between a thickness t1b of a third portion 163a of the high-k layer and the thickness t2b of the second portion 163b of the high-k layer may be in the range of from about 1 Å to about 3 Å. In an example embodiment, a difference between the thickness t3b of the first portion 163c of the high-k layer and the thickness t1b of the third portion 163a of the high-k layer may be in the range of from about 2 Å to about 6 Å.

Referring to FIG. 4C, in a first transistor 100c of a semiconductor device 1c, thicknesses of high-k layers 163a, 163b, 163c, and 163d may be uniform, and thicknesses of interface layers 162a, 162b, 162c, and 162d may become greater as the interface layers 162a, 162b, 162c, and 162d become more distant from the substrate 101 in the direction perpendicular to the upper surface of the substrate 101.

Figure 5:
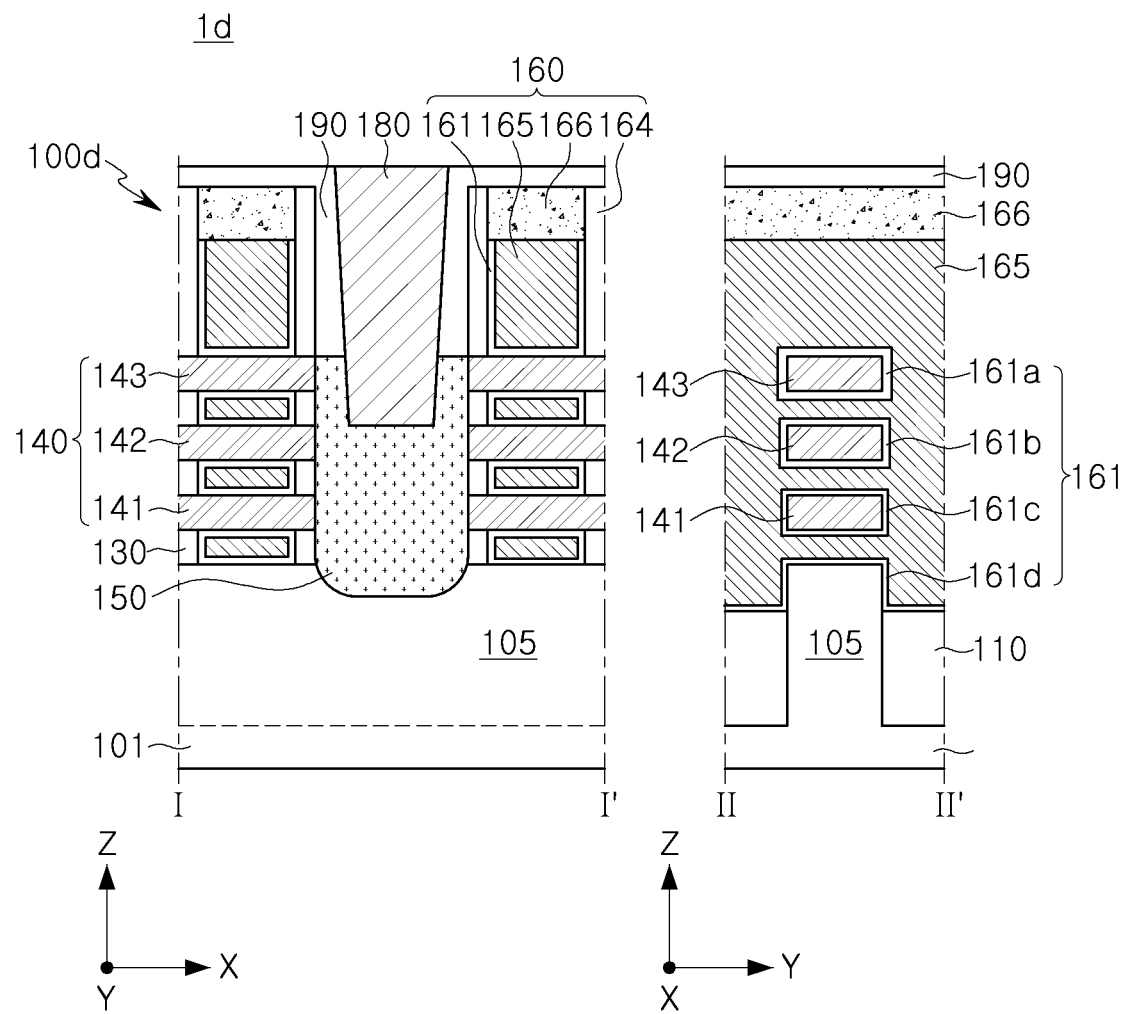
FIG. 5 is a cross-sectional view illustrating a semiconductor device according to example embodiments.

FIG. 5 is a cross-sectional view illustrating a semiconductor device according to example embodiments.

Referring to FIG. 5, a first transistor 100d of a semiconductor device 1d may further include inner spacer layers 130.

The inner spacer layers 130 may be disposed in parallel with the first gate electrode 165 between the first channel structures 140. The inner spacer layers 130 may be disposed on opposite sides of the first gate structure 160 in the first direction, for example, the X direction, on lower surfaces of the first to third channel layers 141, 142, and 143, respectively. The inner spacer layers 130 may have outer side surfaces substantially coplanar with outer side surfaces of the first to third channel layers 141, 142, and 143. Below the third channel layer 143, the first gate electrode 165 may be spaced apart from and electrically separated from the first source/drain regions 150 by the inner spacer layers 130. The inner spacer layers 130 may have a shape in which side surfaces thereof facing the first gate electrode 165 are convexly rounded inward toward the first gate electrode 165, but is not limited thereto. The internal spacer layers 130 may be formed of oxide, nitride, and oxynitride, and in particular, may be formed of a low-k film.

Figure 6:
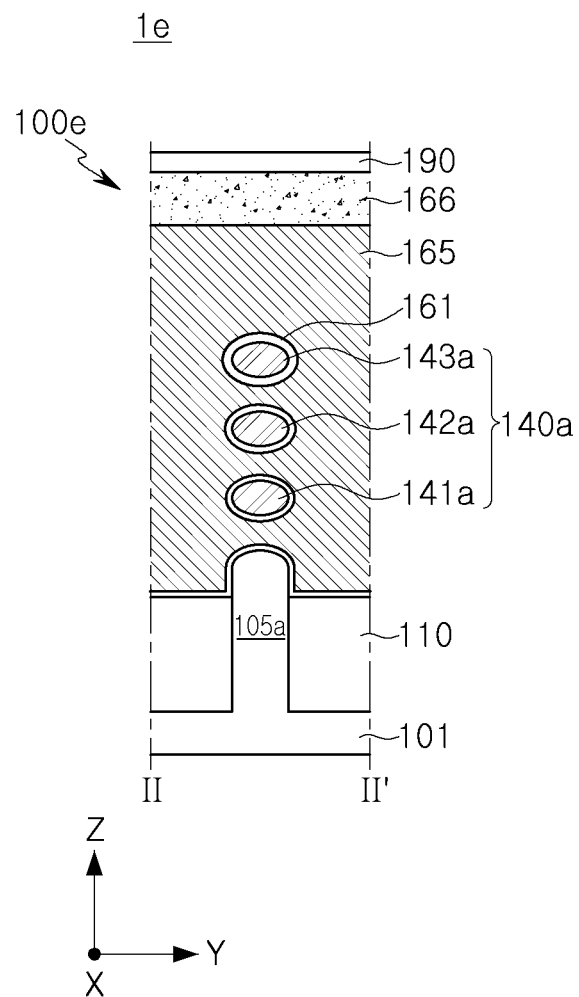
FIG. 6 is a cross-sectional view illustrating a semiconductor device according to example embodiments.

FIG. 6 is a cross-sectional view illustrating a semiconductor device according to example embodiments. FIG. 6 illustrates a region corresponding to a cross section taken along line II-II' of FIG. 1.

Referring to FIG. 6, in a semiconductor device 1e, widths of a first active region 105a and a first channel structure 140a may be different from those of an example embodiment of FIG. 2. The first active region 105a and the first channel structure 140a may have relatively small widths. Therefore, each of a plurality of channel layers 141a, 142a, and 143a of the first channel structure 140a may have a circular shape or an elliptical shape in which a difference in length between a major axis and a minor axis is small, in a cross section in the Y direction. In example embodiments, the widths and shapes of the first active region 105a and the first channel structure 140a may be variously modified.

In an example embodiment, the first gate dielectric layer 161 surrounding the plurality of channel layers 141a, 142a, and 143a may have a ring shape in a cross section in the Y direction.

Figure 7:
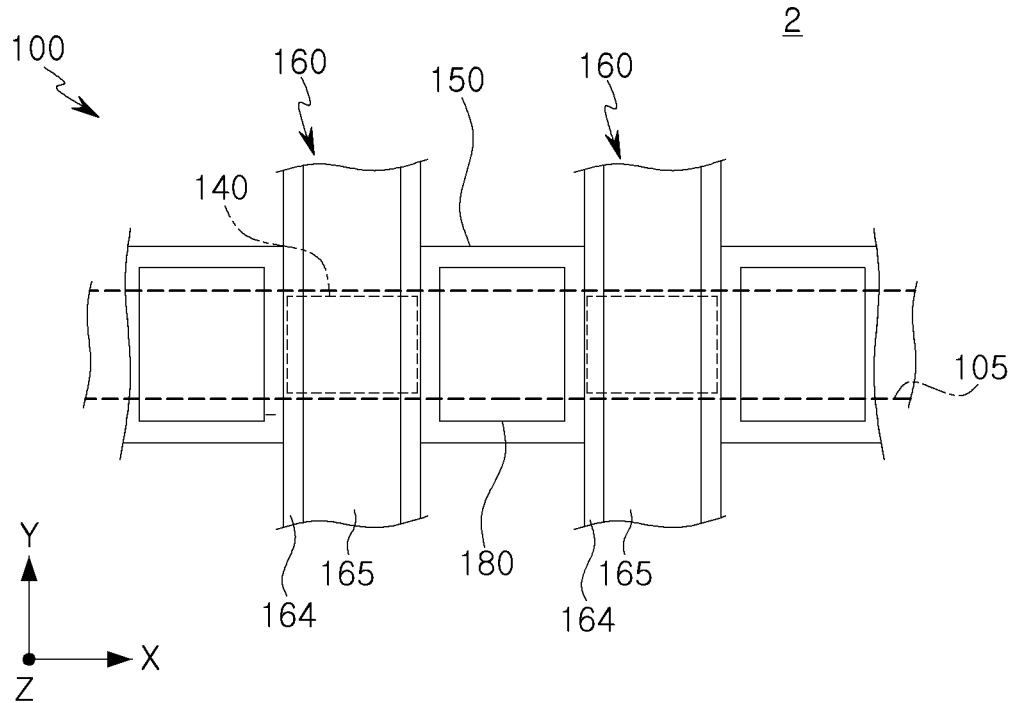
FIG. 7 is a plan view illustrating a semiconductor device according to example embodiments.
Figure 7:
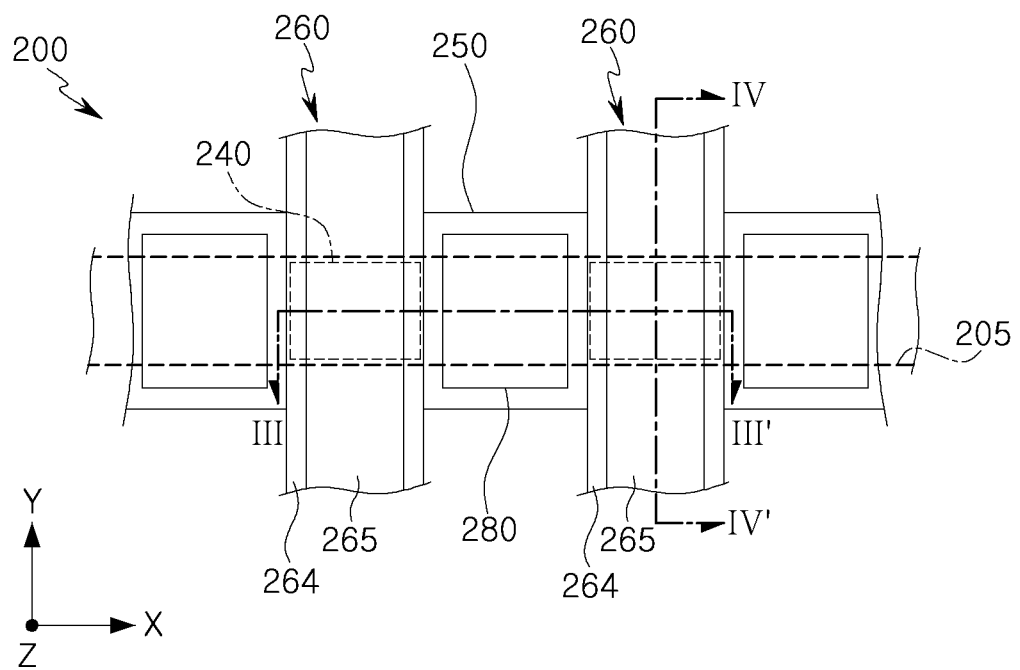

FIG. 7 is a plan view illustrating a semiconductor device according to example embodiments.

Figure 8:
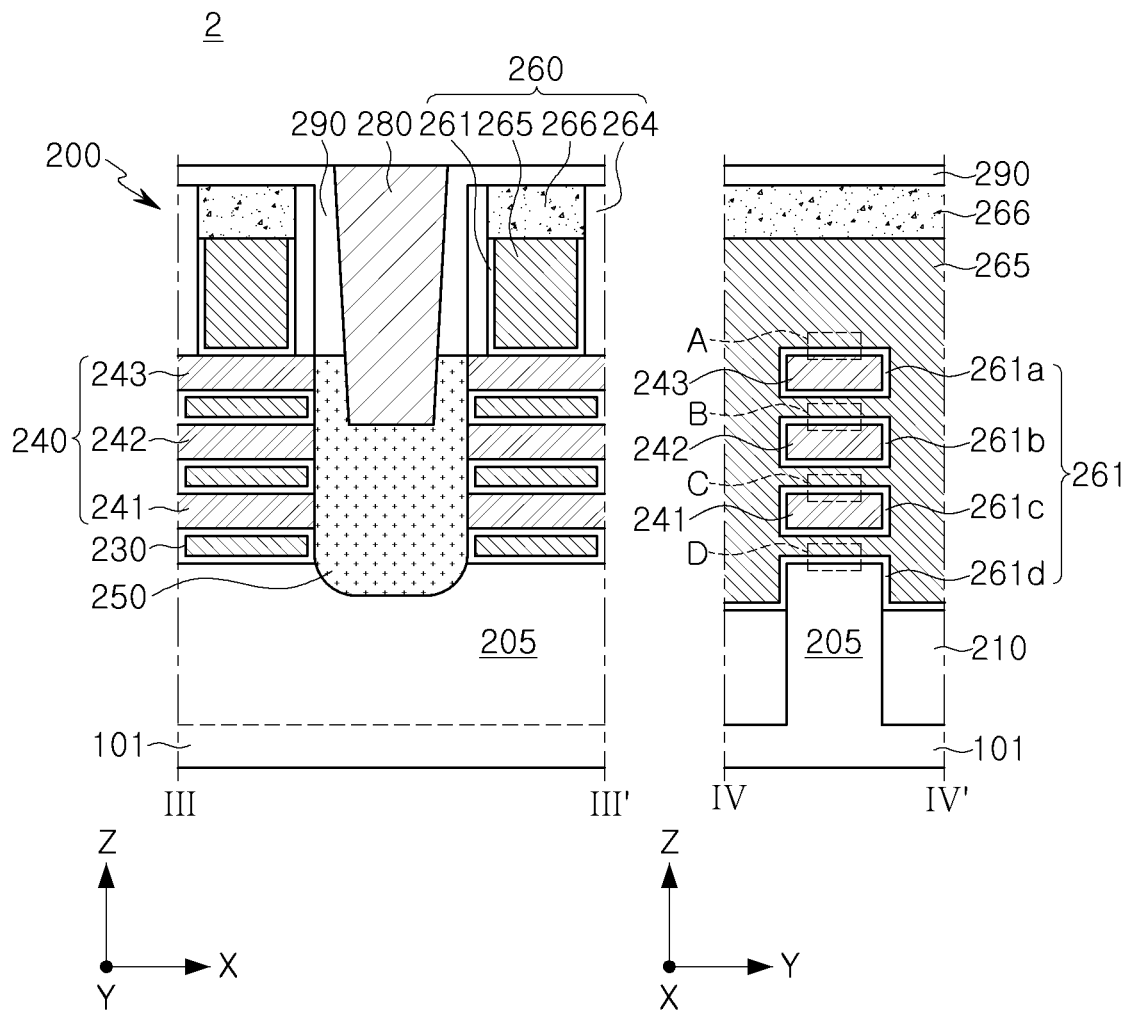
FIG. 8 is a cross-sectional view illustrating the semiconductor device according to example embodiments.

FIG. 8 is a cross-sectional view illustrating the semiconductor device according to example embodiments. FIG. 8 illustrates cross sections of the semiconductor device of FIG. 7 taken along lines III-III' and IV-IV'. For convenience of a description, only main components of the semiconductor device are illustrated in FIGS. 7 and 8.

Figure 9:
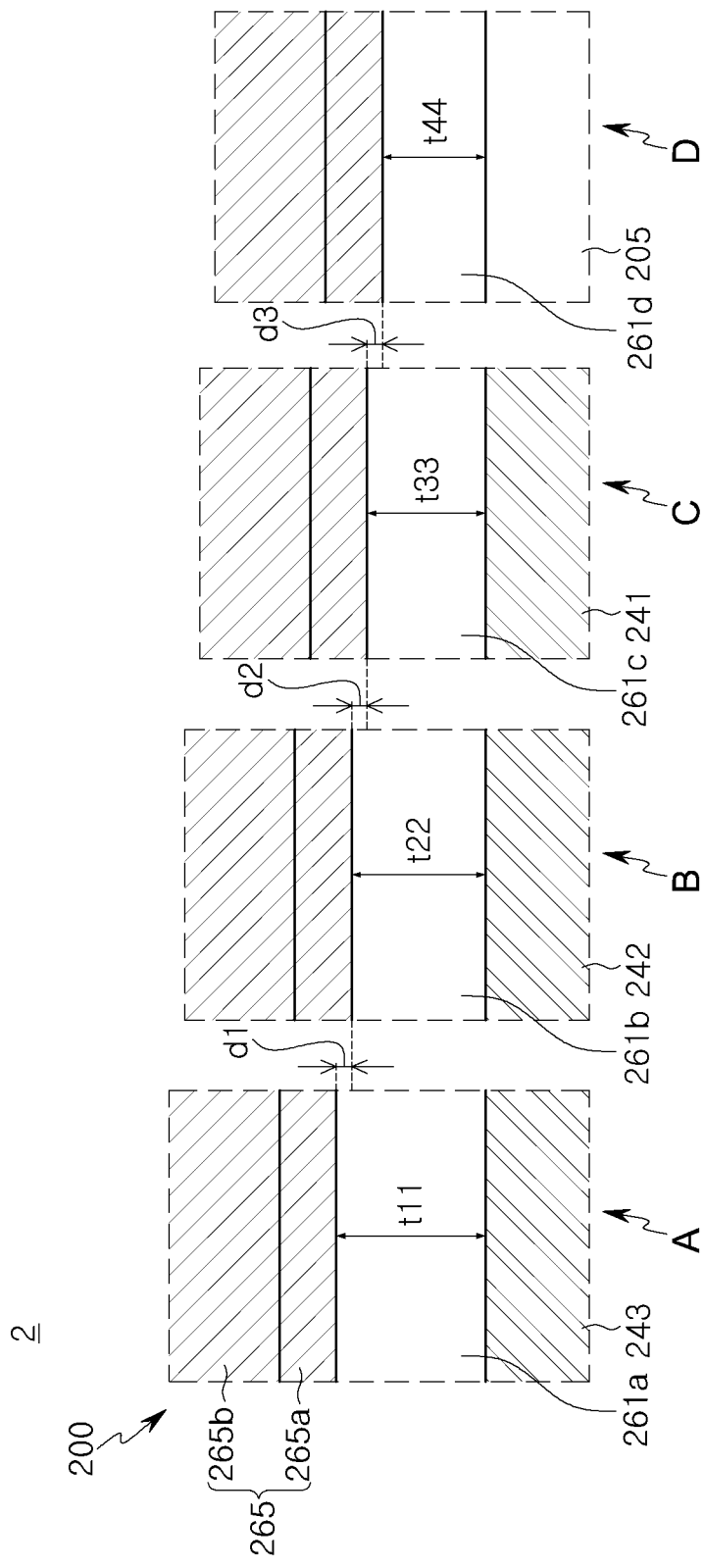
FIG. 9 is a partially enlarged view illustrating a portion of the semiconductor device according to example embodiments.

FIG. 9 is a partially enlarged view illustrating a portion of the semiconductor device according to example embodiments. FIG. 9 is an enlarged view of each of regions A, B, C, and D of FIG. 8.

Referring to FIGS. 7 to 9, a semiconductor device 2 may include a substrate 101, a first transistor 100 including a first active region 105 on the substrate 101, a first channel structure 140 including a plurality of channel layers 141, 142, and 143 disposed on the first active region 105 to be vertically spaced apart from each other, first source/drain regions 150 in contact with the first channel structure 140, and first gate structures 160 extending so as to intersect with the first active region 105. For example, the first active region 105 may extend in a first direction (e.g., an X direction), and the first gate structures 160 may extend in a second direction (e.g., a Y direction) intersecting the first direction. The semiconductor device 2 may further include a second transistor 200 including a second active region 205 on the substrate 101, a second channel structure 240 including a plurality of channel layers 241, 242, and 243 disposed on the second active region 205 to be vertically spaced apart from each other, second source/drain regions 250 in contact with the second channel structure 240, and second gate structures 260 extending so as to intersect the second region 205. For example, the second active region 205 may extend in the first direction, and the second gate structures 260 may extend in the second direction intersecting the first direction. The first transistor 100 may further include first isolation layers 110 and a first interlayer insulating layer 190, and the second transistor 200 may further include second isolation layers 210 and a second interlayer insulating layer 290. The semiconductor device 2 may further include first contact structures 180 connected to the first source/drain regions 150 and second contact structures 280 connected to the second source/drain regions 250. In some embodiments, the second active region 200 may be spaced apart from the first active region 100 in the second direction. The present invention is not limited thereto. For example, the second active region 200 may be spaced apart from the first active region 100 in the first direction.

The same description as the description for the first transistors 100, 100a, 100b, 100c, 100d, and 100e described above with reference to FIGS. 1 to 6 may be applied to the first transistor 100 of the semiconductor device 2 according to an example embodiment.

The second active region 205 may be defined by the second isolation layer 210 in the substrate 101 and may be disposed to extend in the first direction, for example, the X direction. The second active region 205 may have a structure in which it protrudes from the substrate 101. An upper end of the second active region 205 may be disposed to protrude from an upper surface of the second isolation layer 210 by a predetermined height. The second active region 205 may be formed as a portion of the substrate 101 or may include an epitaxial layer grown from the substrate 101. However, on opposite sides of the second gate structure 260, the second active regions 205 on the substrate 101 may be partially recessed, and the second source/drain regions 250 may be disposed on the recessed second active regions 205. Therefore, as illustrated in FIG. 8, the second active region 205 may have a relatively high height below the second channel structure 240 and the second gate structure 260. According to example embodiments, the second active region 205 may include or may be doped with impurities, and at least some of the second active regions 205 may include different conductivity-type impurities, but are not limited thereto. A plurality of second active regions 205 may be disposed to be spaced apart from each other in the Y direction. The present invention is not limited thereto. For example, a plurality of second active regions may be disposed to be spaced apart from each other in the X direction.

The second isolation layer 210 may define the second active region 205 in the substrate 101. The second isolation layer 210 may be formed by, for example, a shallow trench isolation (STI) process. The second isolation layer 210 may expose upper sidewalls of the second active region 205. According to example embodiments, the second isolation layer 210 may include a region that extends deeper to a lower portion of the substrate 101 between the second active regions 205. The second isolation layer 210 may have a curved upper surface having a higher level as it becomes more adjacent to the second active region 205, but a shape of the upper surface of the second isolation layer 210 is not limited thereto. The second isolation layer 210 may be formed of an insulating material. The second isolation layer 210 may be formed of, for example, oxide, nitride, or a combination thereof.

The second channel structure 240 may include a fourth channel layer 241, a fifth channel layer 242 on the fourth channel layer 241, and a sixth channel layer 243 on the fifth channel layer 242, which are two or more channel layers disposed on the second active region 205 to be spaced apart from each other in a direction perpendicular to an upper surface of the second active region 205, for example, in the Z direction. The fourth to sixth channel layers 241, 242, and 243 may be connected to the second source/drain region 250 and be spaced apart from the upper surface of the second active region 205.

The fourth to sixth channel layers 241, 242, and 243 may have a width that is the same as or similar to that of the second active region 205 in the Y direction, and may have a width that is the same as or similar to that of the second gate structure 260 in the X direction. However, according to example embodiments, the fourth to sixth channel layers 241, 242, and 243 may have a reduced width so that side surfaces thereof are positioned below the second gate structure 260 in the X direction.

The fourth to sixth channel layers 241, 242, and 243 may be formed of a semiconductor material, and may include or may be formed of at least one of, for example, silicon (Si), silicon germanium (SiGe), and germanium (Ge). The fourth to sixth channel layers 241, 242, and 243 may be formed of the same material as the substrate 101, for example. The number and shapes of channel layers 241, 242, and 243 constituting one second channel structure 240 may be variously modified in example embodiments.

The second source/drain regions 250 may be disposed on the second active region 205 on opposite sides of the second channel structure 240. The second source/drain regions 250 may be provided as a source region or a drain region of a transistor. The second source/drain region 250 may be disposed to cover side surfaces of each of the fourth to sixth channel layers 241, 242, and 243 of the second channel structure 240 and cover the upper surface of the second active region 205 at a lower end of the second source/drain region 250. The second source/drain region 250 may be disposed in a region of the second active region 205 where an upper portion of the second active region 205 is partially recessed. For example, the second source/drain region 250 may be partially buried in the upper portion of the second active region 205, thereby increasing a contact area between the second source/drain region 250 and the second active region 205. In example embodiments, whether or not to recess the upper portion of the second active region 205 and, if recessed, a depth at which the upper portion of the second active region 205 is recessed may be variously modified. The second source/drain regions 250 may be a semiconductor layer including or being formed of silicon (Si) and may be formed of an epitaxial layer. In an example embodiment, the second source/drain regions 250 may include a first conductivity-type semiconductor material layer doped with a first dopant as in the first source/drain region 150 or may include a second conductivity-type semiconductor material layer doped with a second dopant different from the first dopant of the first source/drain regions 150. In an example embodiment, the second source/drain regions 250 may have a merged shape in which they are connected to each other between the second active regions 205 adjacent to each other in the Y direction, but are not limited thereto.

The second gate structure 260 may be disposed to intersect with the second active region 205 and the second channel structures 240 above the second active region 205 and the second channel structures 240 and extend in one direction, for example, the Y direction. Channel regions of transistors may be formed in the second active region 205 as the second channel structures 240 intersecting the second gate structure 260. The second gate structure 260 may include a second gate electrode 265, a second gate dielectric layer 261, spacer layers 264 on side surfaces of the second gate electrode 265, and a second gate capping layer 266 on an upper surface of the second gate electrode 265.

The second gate dielectric layer 261 may be disposed between the second active region 205 and the second gate electrode 265 and between the second channel structure 240 and the second gate electrode 265, and may be disposed to cover at least some of surfaces of the second gate electrode 265. For example, the second gate dielectric layer 261 may be disposed to surround all surfaces of the second gate electrode 265 except for a top surface of the second gate electrode 265. The second gate dielectric layer 261 may extend between the second gate electrode 265 and the spacer layers 264, but is not limited thereto.

As illustrated in FIG. 9, the second gate dielectric layer 261 may include first to third portions 261c, 261b, and 261a disposed between each of the plurality of channel layers 241, 242, and 243 and the second gate electrode 265, and a fourth portion 261d disposed between the second active region 205 and the second gate electrode 265.

In a cross section (see right diagram of FIG. 8) which may be shown in the Y direction, the second gate dielectric layer 261 may include the first portion 261c surrounding the fourth channel layer 241, the second portion 261b surrounding the fifth channel layer 242, and the third portion 261a surrounding the sixth channel layer 243. For example, each of the first to third portions 261c, 261b, and 261a may be formed to surround surfaces of a corresponding one of the fourth to sixth channel layers 241, 242, and 243 in the cross section which may be shown in the Y direction.

In an example embodiment, the second gate dielectric layer 261 may be formed to have a conformal, thickness-uniform layer. In an example embodiment, in the second gate dielectric layer 261, thicknesses of the portions 261c, 261b, and 261a surrounding the plurality of channel layers 241, 242, and 243, respectively, may be uniform in the direction perpendicular to the upper surface of the substrate 101. In some embodiments, unlike the first gate dielectric layer 161, thicknesses t11, t22, t33, and t44 of the fourth portion 261d and the first to third portions 261c, 261b, and 261a may be substantially the same as each other. The present invention is not limited thereto. In some embodiments, similarly to the first gate dielectric layer 161, the first to third portions 261c, 261b, and 261a, and the fourth portion 261d in the second gate dielectric layer 261 may have different thicknesses from each other. For example, the first to third portions 261c, 261b, and 261a, and the fourth portion 261d may have thicknesses that become greater as they become more distant from the substrate 101 in the direction perpendicular to the upper surface of the substrate 101.

The second gate dielectric layer 261 may include or may be formed of oxide, nitride, or a high-k material.

The second gate electrode 265 may be disposed to fill spaces between the plurality of channel layers 241, 242, and 243 above the second active region 205 and extend above the second channel structure 240. The second gate electrode 265 may be spaced apart from the plurality of channel layers 241, 242, and 243 by the second gate dielectric layer 261. Distances between the second gate electrode 265 and each of the plurality of channel layers 241, 242, and 243 may be different from each other.

The second gate electrode 265 may include or may be formed of a conductive material, and may include or may be formed of, for example, a metal nitride such as titanium nitride (TiN), tantalum nitride (TaN), and tungsten nitride (WN), metal such as aluminum (Al), tungsten (W), and molybdenum (Mo), or a semiconductor material such as doped polysilicon.

In an example embodiment, the second gate electrode 265 may include two or more layers, that is, multiple layers, as illustrated in FIG. 9. In an example embodiment, the second gate electrode 265 may include a third conductive layer 265a disposed on the second gate dielectric layer 261 and a fourth conductive layer 265b disposed on the third conductive layer 265a. In an example embodiment, the third conductive layer 265a and the fourth conductive layer 265b may include or may be formed of different conductive materials. The third conductive layer 265a may be referred to as a second work function control pattern. In an example embodiment, the third conductive layer 265a may be a plurality of layers including different conductive materials. In an example embodiment, the third conductive layer 265a may be formed as layers of which the number is different from that of the first work function control pattern 165a of the first transistor 100 or may be formed of a conductive material different from that of the first work function control pattern 165a.

The second spacer layers 264 may be disposed on opposite side surfaces of the second gate electrode 265 and may extend in the Z direction perpendicular to the upper surface of the substrate 101. In an example embodiment, each of the second spacer layers 264 may include a portion where an outer side surface thereof is a curved surface so that a width of an upper portion thereof is smaller than a width of a lower portion thereof. The second spacer layers 264 may insulate the second source/drain regions 250 and the second gate electrodes 265 from each other. The second spacer layers 264 may have a multilayer structure according to example embodiments. The second spacer layers 264 may be formed of oxide, nitride, or oxynitride. In some embodiments, the second spacer layers 264 may be formed of a low-k dielectric film.

The second gate capping layer 266 may be disposed on the second gate electrode 265. The second gate capping layer 266 may be disposed to extend in the second direction, for example, the Y direction along the upper surface of the second gate electrode 265. Side surfaces of the second gate capping layer 266 may be surrounded by the second spacer layers 264. An upper surface of the second gate capping layer 266 may be substantially coplanar with upper surfaces of the second spacer layers 264, but is not limited thereto. The second gate capping layer 266 may be formed of oxide, nitride, or oxynitride. In some embodiments, the second gate capping layer 266 may include or may be formed of at least one of SiO, SiN, SiCN, SiOC, SiON, and SiOCN.

The second interlayer insulating layer 290 may be disposed to cover the second source/drain regions 250 and the second gate structures 260 and cover the second isolation layer 210. The second interlayer insulating layer 290 may include or may be formed of at least one of oxide, nitride, and oxynitride. In some embodiments, the second interlayer insulating layer 290 may include or may be formed of, for example, a low-k material.

Figure 10:
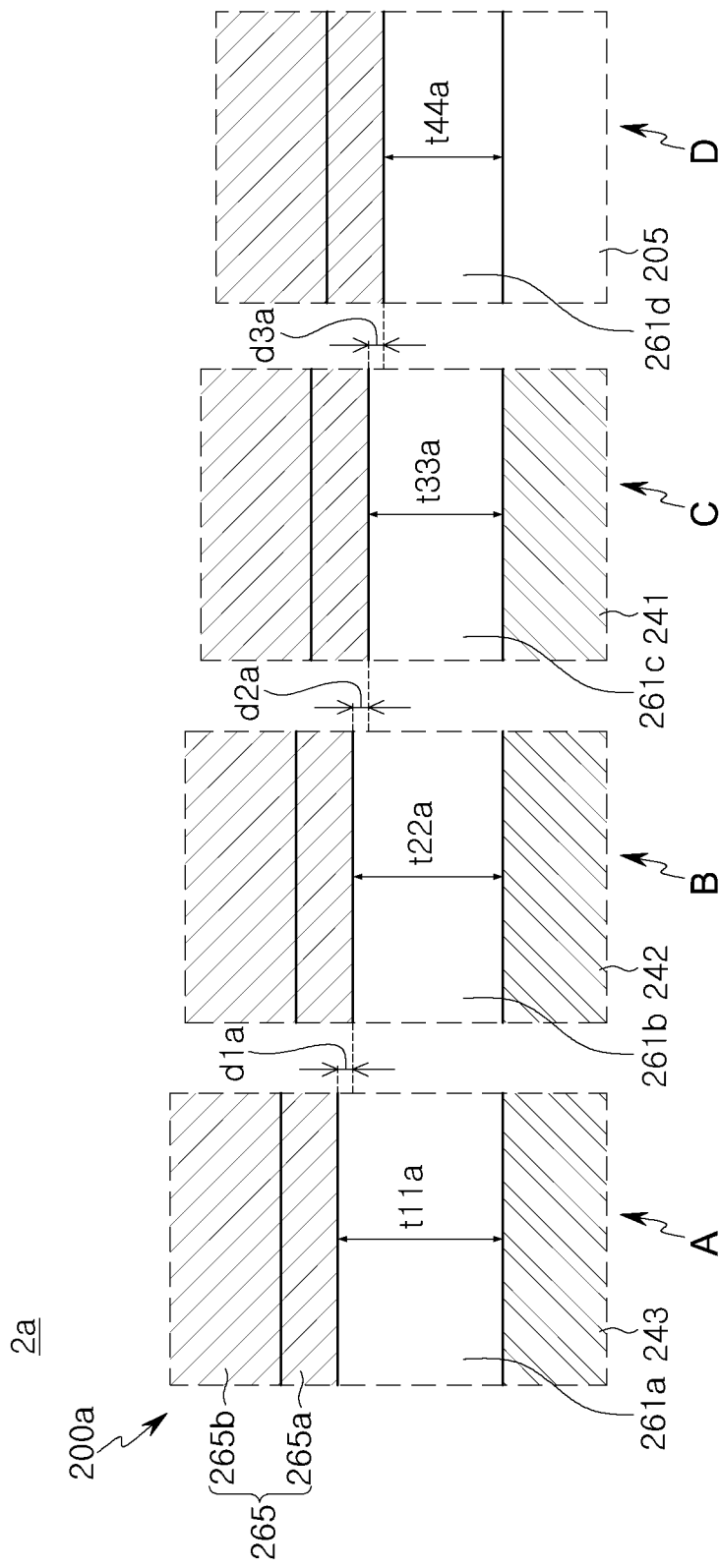
FIG. 10 is a partially enlarged view illustrating a portion of a semiconductor device according to example embodiments.
Figure 11:
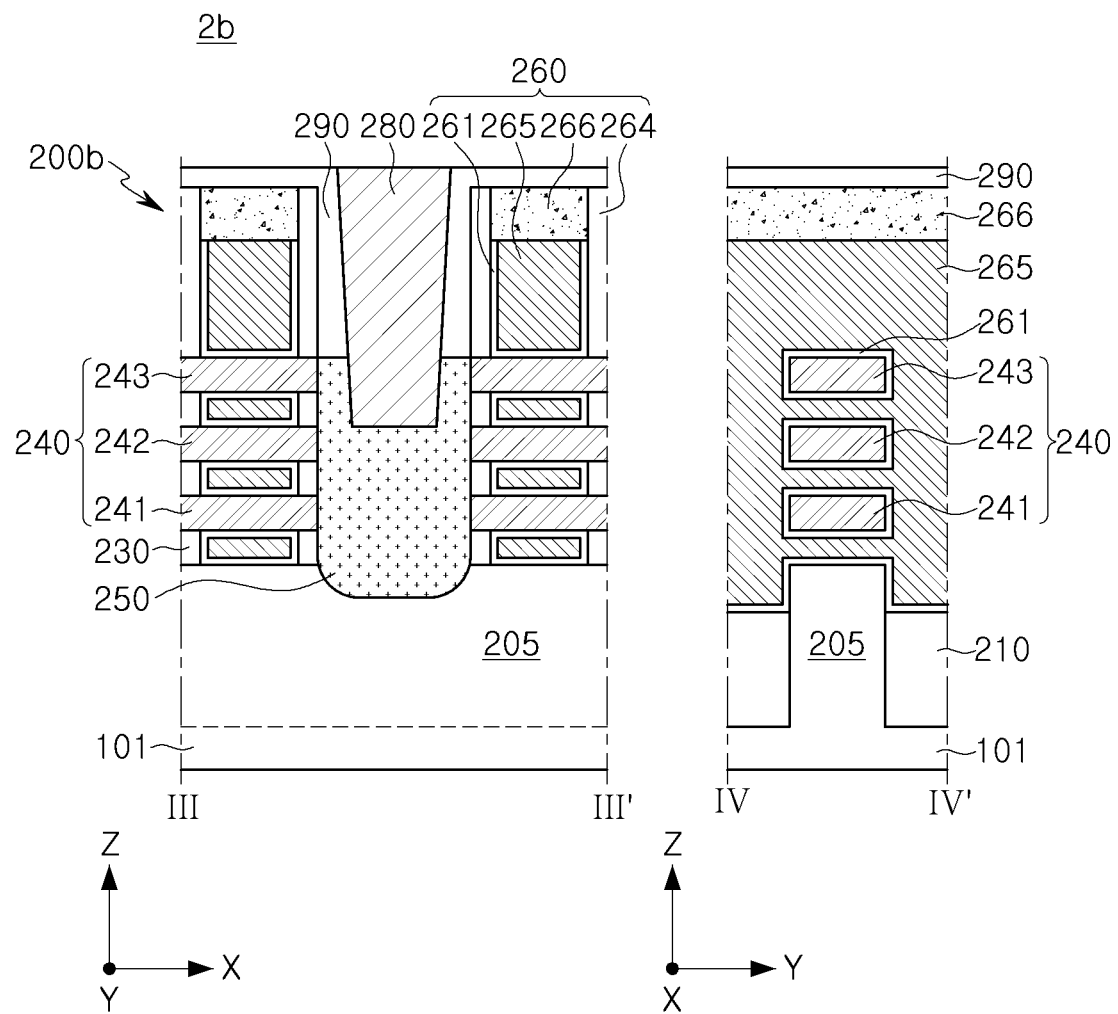
FIG. 11 is a cross-sectional view illustrating a semiconductor device according to example embodiments.

In FIGS. 10 and 11, the same description as that described with reference to FIGS. 7 to 9 is omitted.

FIG. 10 is a partially enlarged view illustrating a portion of a semiconductor device according to example embodiments. FIG. 10 is an enlarged view of regions corresponding to each of regions A, B, C, and D of FIG. 8.

Referring to FIG. 10, in a second transistor 200a of a semiconductor device 2a, a second gate dielectric layer 261 may have a thickness that becomes greater as it becomes more distant from the substrate 101 in the direction perpendicular to the upper surface of the substrate 101. In an example embodiment, in the second gate dielectric layer 261, first to third portions 261c, 261b, and 261a that surround the plurality of channel layers 241, 242, and 243, respectively, may have thicknesses that become gradually greater as they become more distant from the substrate 101 in the direction perpendicular to the upper surface of the substrate 101. The second gate dielectric layer 261 may have a maximum thickness at a portion disposed most adjacent to the second gate capping layer 266.

In an example embodiment, thicknesses t33a, t22a, t11a, and t44a of the first to fourth portions 261c, 261b, 261a, and 261d of the second gate dielectric layer 261, respectively, may be different from each other. In an example embodiment, the thickness t33a of the first portion 261c of the second gate dielectric layer 261 may be greater than the thickness t44a of the fourth portion 261d of the second gate dielectric layer 261, the thickness t22a of the second portion 261b of the second gate dielectric layer 261 may be greater than the thickness t33a of the first portion 261c of the second gate dielectric layer 261, and the thickness t11a of the third portion 261a of the second gate dielectric layer 261 may be greater than the thickness t22a of the second portion 261b of the second gate dielectric layer 261. In an example embodiment, the thickness t22a of the second portion 261b of the second gate dielectric layer 261 may be substantially the same as the thickness t33a of the first portion 261c of the second gate dielectric layer 261, and the thickness t11a of the third portion 261a of the second gate dielectric layer 261 may be greater than the thickness t22a of the second portion 261b of the second gate dielectric layer 261.

In an example embodiment, an average thickness of the second gate dielectric layer 261 of the second transistor 200a and an average thickness of the first gate dielectric layer 161 of the first transistor 100 may be different from each other. In an example embodiment, the first transistor 100 and the second transistor 200a may include the first work function control pattern 165a (see FIG. 3) and the second work function control pattern 265a, respectively. The first work function control pattern 165a and the second work function control pattern 265a may include or may be formed of different materials and/or different numbers of layers from each other. In some embodiment, an average thickness of the second gate dielectric layer 261 may be greater than an average thickness of the first gate dielectric layer 161.

In an example embodiment, a difference between the thickness t11a of the third portion 261a and the thickness t33a of the first portion 261c of the second transistor 200a may be greater than a difference between the thickness t1 of the third portion 161a and the thickness t3 of the first portion 161c of the first transistor 100.

FIG. 11 is a cross-sectional view illustrating a semiconductor device according to example embodiments.

Referring to FIG. 11, a second transistor 200b of a semiconductor device 2b may further include inner spacer layers 230.

The inner spacer layers 230 may be disposed in parallel with the second gate electrode 265 between the second channel structures 240. The inner spacer layers 230 may be disposed on opposite sides of the second gate structure 260 in the first direction, for example, the X direction, on lower surfaces of the fourth to sixth channel layers 241, 242, and 243, respectively. The inner spacer layers 230 may have outer side surfaces substantially coplanar with outer side surfaces of the fourth to sixth channel layers 241, 242, and 243. Below the sixth channel layer 243, the second gate electrode 265 may be spaced apart from and electrically separated from the second source/drain regions 250 by the inner spacer layers 230. The inner spacer layers 230 may have a shape in which side surfaces thereof facing the second gate electrode 265 are convexly rounded inward toward the second gate electrode 265, but is not limited thereto. The internal spacer layers 130 may be formed of oxide, nitride, or oxynitride. In some embodiments, the internal spacer layer 130 may be formed of a low-k film.

FIGS. 12 to 21 are diagrams illustrating processes according to a process sequence in order to describe a method of manufacturing a semiconductor device according to example embodiments. An example embodiment of a method of manufacturing the semiconductor device illustrated in FIGS. 1 to 3 will be described with reference to FIGS. 12 to 21.

Figure 12:
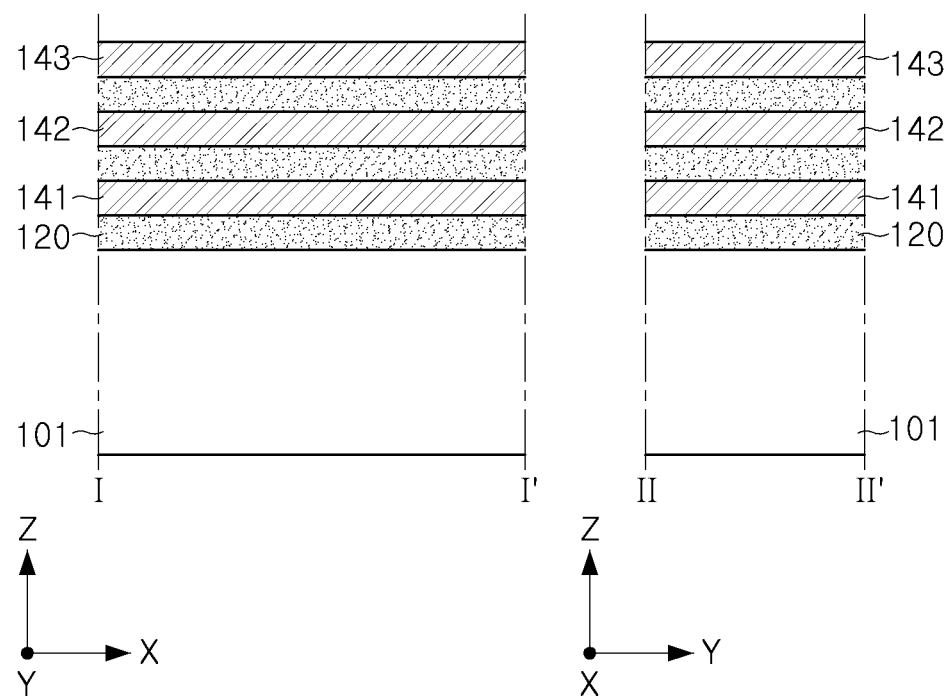
FIGS. 12 to 17, 18A and 18B, 19A and 19B, 20 and 21 are diagrams illustrating processes according to a process sequence in order to describe a method of manufacturing a semiconductor device according to example embodiments.

Referring to FIG. 12, sacrificial layers 120 and channel layers 141, 142, and 143 may be alternately stacked on a substrate 101.

The sacrificial layers 120 may be layers that are to be replaced with the first gate dielectric layer 161 and the first gate electrode 165 as illustrated in FIG. 2 through a subsequent process. The sacrificial layers 120 may be formed between the substrate 101 and the first channel layer 141, between the first channel layer 141 and the second channel layer 142, and between the second channel layer 142 and the third channel layers 143. The sacrificial layers 120 may be formed of a material having etch selectivity with respect to the channel layers 141, 142, and 143. The channel layers 141, 142, and 143 may include or may be formed of a material different from that of the sacrificial layers 120. The sacrificial layers 120 and the channel layers 141, 142, and 143 may include, for example, a semiconductor material including at least one of silicon (Si), silicon germanium (SiGe), and germanium (Ge). In some embodiments, the sacrificial layers 120 and the channel layers 141, 142, and 143 may include different materials from each other, and may or may not include impurities. For example, the sacrificial layers 120 may include or may be formed of silicon germanium (SiGe), and the channel layers 141, 142, and 143 may include or may be formed of silicon (Si).

The sacrificial layers 120 and the channel layers 141, 142, and 143 may be formed by performing an epitaxial growth process using the substrate 101 as a seed. Each of the sacrificial layers 120 and the channel layers 141, 142, and 143 may have a thickness in the range of from about 1 Å to about 100 nm. The number of channel layers 141, 142, and 143 alternately stacked with the sacrificial layer 120 may be variously modified in example embodiments.

Figure 13:
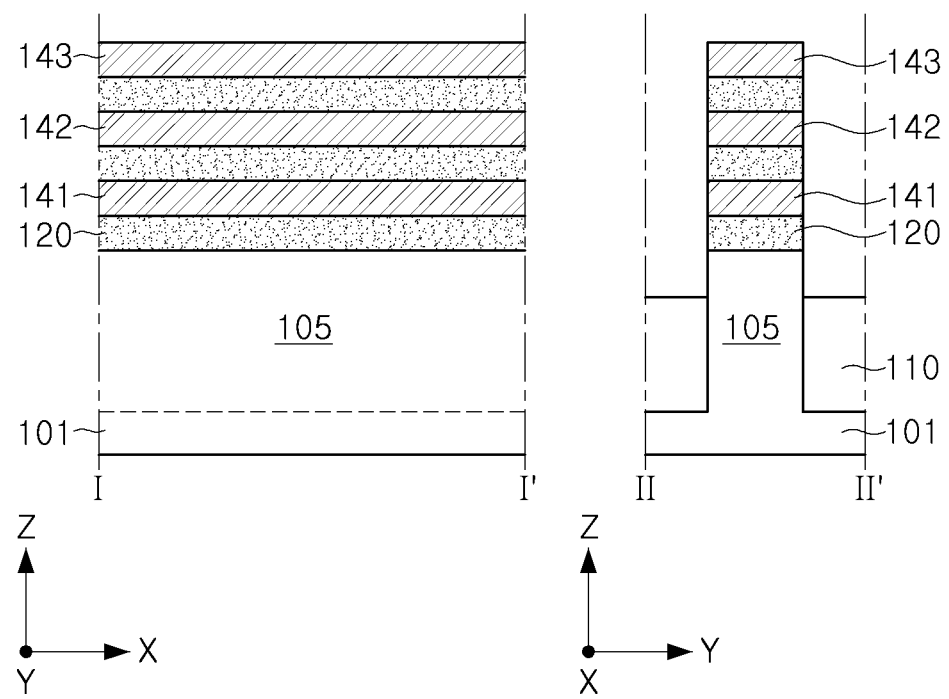

Referring to FIG. 13, active structures may be formed by removing a stacked structure of the sacrificial layers 120 and the channel layers 141, 142, and 143 and a portion of the substrate 101.

The active structure may include the sacrificial layers 120 and the channel layers 141, 142, and 143 alternately stacked with each other, and may further include an active region 105 protruding from an upper surface of the substrate 101 by removing a portion of the substrate 101. The active structures may be formed in a shape of a line extending in one direction, for example, in the X direction, and may be disposed to be spaced apart from each other in the Y direction.

In a region from which a portion of the substrate 101 is removed, isolation layers 110 may be formed by filling an insulating material and then recessing the active region 105 so that the active region 105 protrudes. For example, the insulating material may fill a space of the removed portion of the substrate 101, and may be recessed to form the isolation layers 110. The active region 105 may protrude from an upper surface of the isolation layers 110. Upper surfaces of the isolation layers 110 may be formed on a level below an upper surface of the active region 105.

Figure 14:
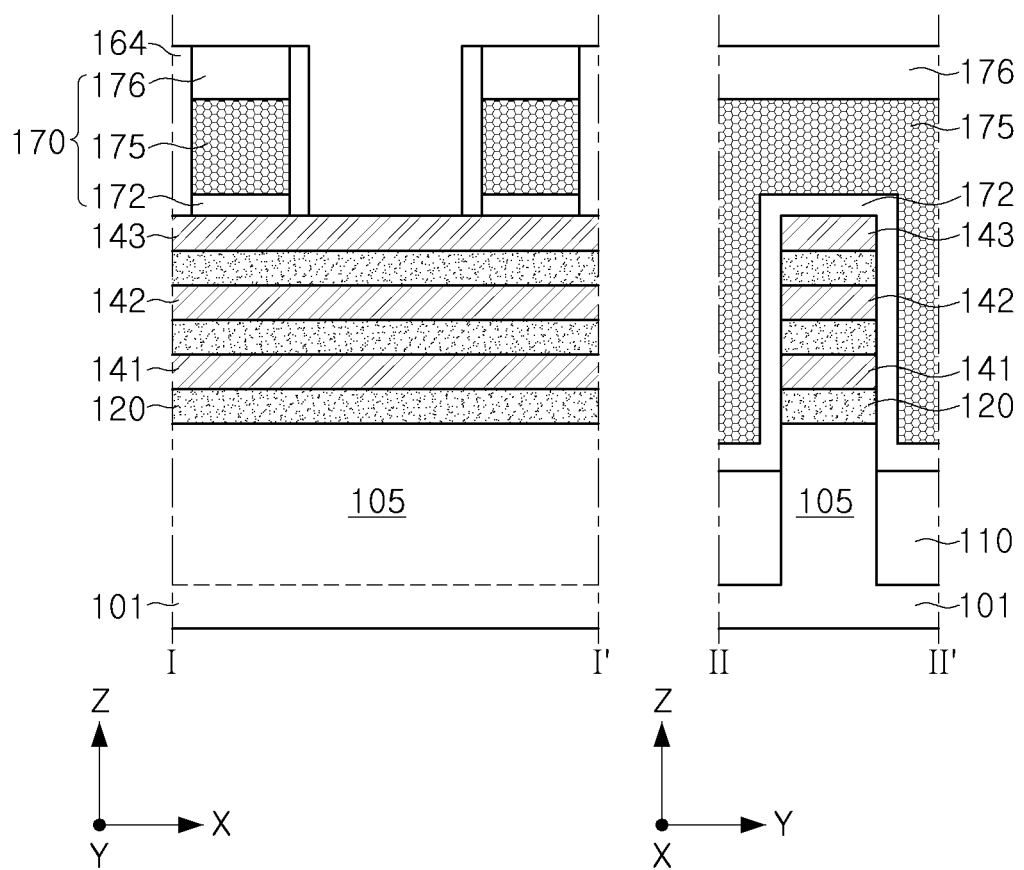

Referring to FIG. 14, sacrificial gate structures 170 and spacer layers 164 may be formed on the active structures.

The sacrificial gate structures 170 may be sacrificial structures formed in a region in which the gate dielectric layer 162 and the gate electrode 165 are disposed above the channel structures 140, as illustrated in FIG. 2, through a subsequent process. The sacrificial gate structure 170 may include first and second sacrificial gate layers 172 and 175 and a mask pattern layer 176 that are sequentially stacked. The first and second sacrificial gate layers 172 and 175 may be patterned using the mask pattern layer 176. The first and second sacrificial gate layers 172 and 175 may be an insulating layer and a conductive layer, respectively, but are not limited thereto, and the first and second sacrificial gate layers 172 and 175 may also be formed as a single layer. For example, the first sacrificial gate layer 172 may include silicon oxide, and the second sacrificial gate layer 175 may include polysilicon. The mask pattern layer 176 may include or may be formed of silicon oxide or silicon nitride. The sacrificial gate structures 170 may have a shape of a line intersecting the active structures and extending in one direction. The sacrificial gate structures 170 may extend in, for example, the Y direction and may be disposed to be spaced apart from each other in the X direction.

The spacer layers 164 may be formed on opposite sidewalls of the sacrificial gate structures 170. The spacer layers 164 may be formed by forming films having a uniform thickness along upper surfaces and side surfaces of the sacrificial gate structures 170 and the active structures, and then performing anisotropic etching on the films. The spacer layers 164 may be formed of a low-k dielectric material. In some embodiments, the spacer layers 164 may include, for example, at least one of SiO, SiN, SiCN, SiOC, SiON, and SiOCN.

Figure 15:
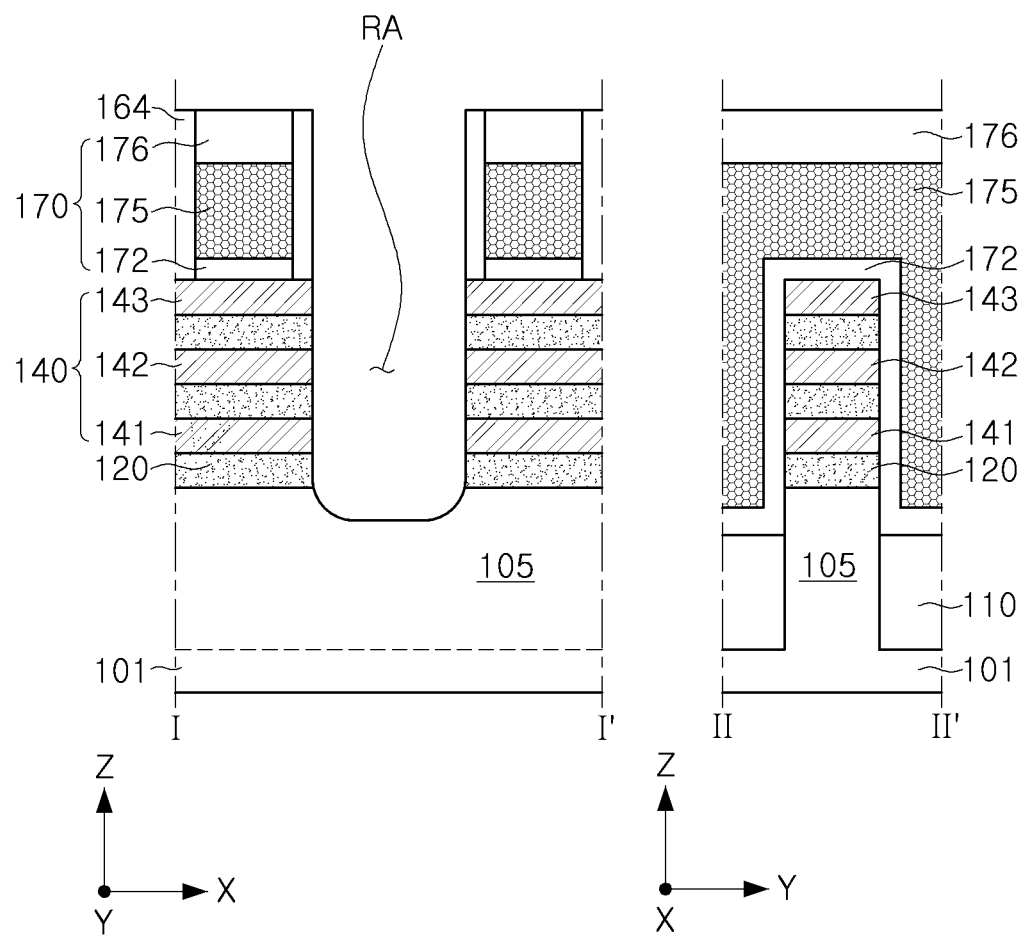

Referring to FIG. 15, the channel structures 140 may be formed by removing the exposed sacrificial layers 120 and channel layers 141, 142, and 143 between the sacrificial gate structures 170 to form a recess portion RA.

First, the exposed sacrificial layers 120 and channel layers 141, 142, and 143 may be removed using the sacrificial gate structures 170 and the spacer layers 164 as masks. As a result, the channel layers 141, 142, and 143 have a limited length in the X direction and form the channel structure 140. In an example, the sacrificial layers 120 and the channel structures 140 may be partially removed from side surfaces below the sacrificial gate structures 170, and opposite sides of the sacrificial layers 120 and the channel structures 140 in the X direction may be positioned below the sacrificial gate structures 170 and the spacer layers 164.

In an example embodiment, the sacrificial layers 120 exposed by the recess portion RA may be partially removed from side surfaces (i.e., via the recess portion RA), and the inner spacer layers 130 (see FIG. 5) may be formed in regions in which the sacrificial layers 120 are removed.

Figure 16:
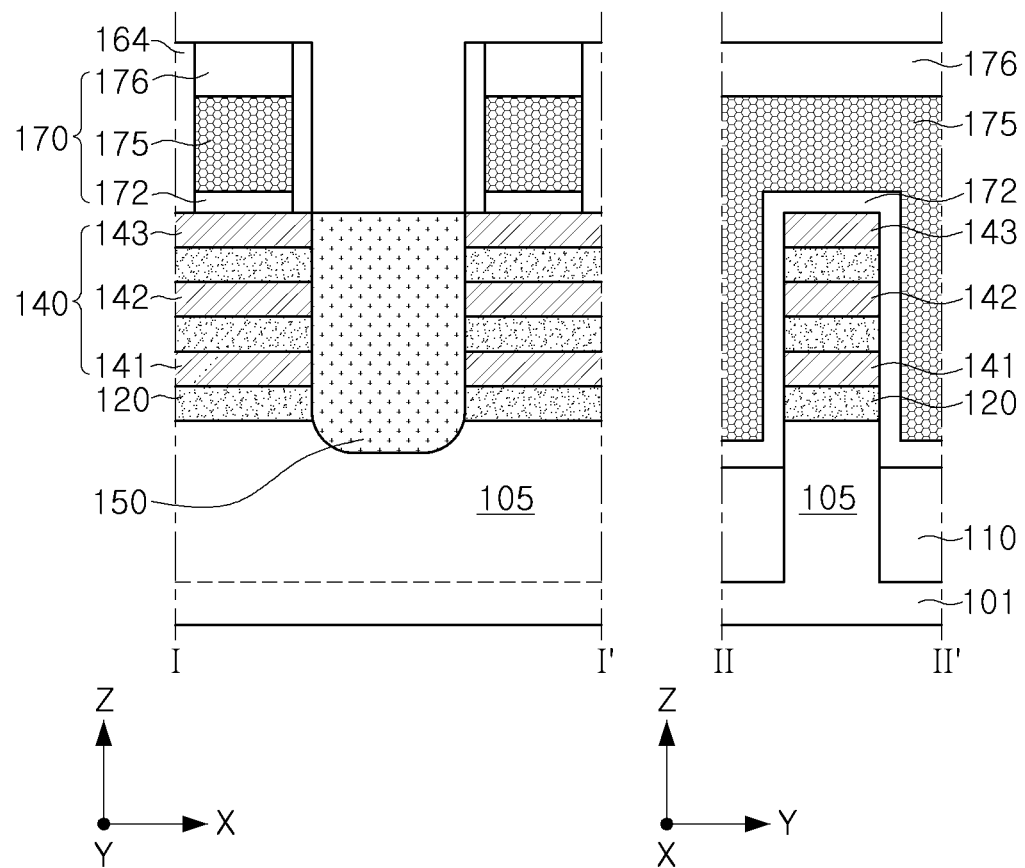

Referring to FIG. 16, source/drain regions 150 may be formed on the active region 105 on opposite sides of the sacrificial gate structures 170.

The source/drain regions 150 may be formed by performing an epitaxial growth process in the recess portion RA. The source/drain regions 150 may be connected to side surfaces of the plurality of channel layers 141, 142, and 143 of the channel structures 140. Upper surfaces of the source/drain regions 150 may be disposed on a level substantially the same as a level of an upper surface of the third channel layer 143, but are not limited thereto, and may be disposed on a level higher than the level of the upper surface of the third channel layer 143. The source/drain regions 150 may include or may be doped with impurities by in-situ doping, and may include a plurality of layers having different doping elements and/or doping concentrations.

Figure 17:
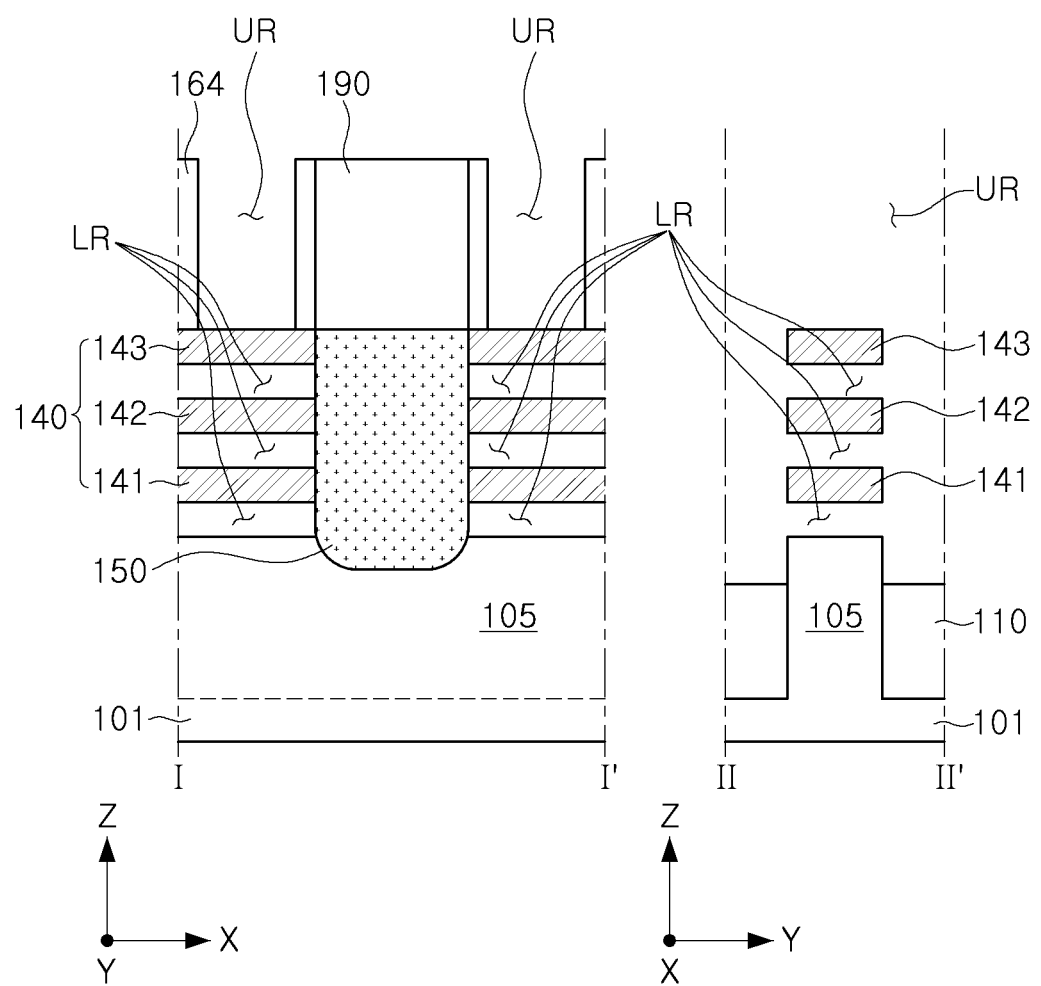

Referring to FIG. 17, an interlayer insulating layer 190 may be formed on the source/drain regions 150, and the sacrificial gate structures 170 and the sacrificial layers 120 may be removed.

The interlayer insulating layer 190 may be partially formed by forming an insulating film covering the sacrificial gate structures 170 and the source/drain regions 150 and performing a planarization process to expose an upper surface of the mask pattern layer 176.

The sacrificial gate structures 170 and the sacrificial layers 120 may be selectively removed with respect to the spacer layers 164, the interlayer insulating layer 190, and the channel structures 140. First, the sacrificial gate structures 170 may be removed to form upper gap regions UR, and the sacrificial layers 120 exposed through the upper gap regions UR may then be removed to form lower gap regions LR. For example, when the sacrificial layers 120 include or are formed of silicon germanium (SiGe) and the channel structures 140 include or are formed of silicon (Si), the sacrificial layers 120 may be selectively removed by performing a wet etching process using a peracetic acid as an etchant.

Figure 18A:
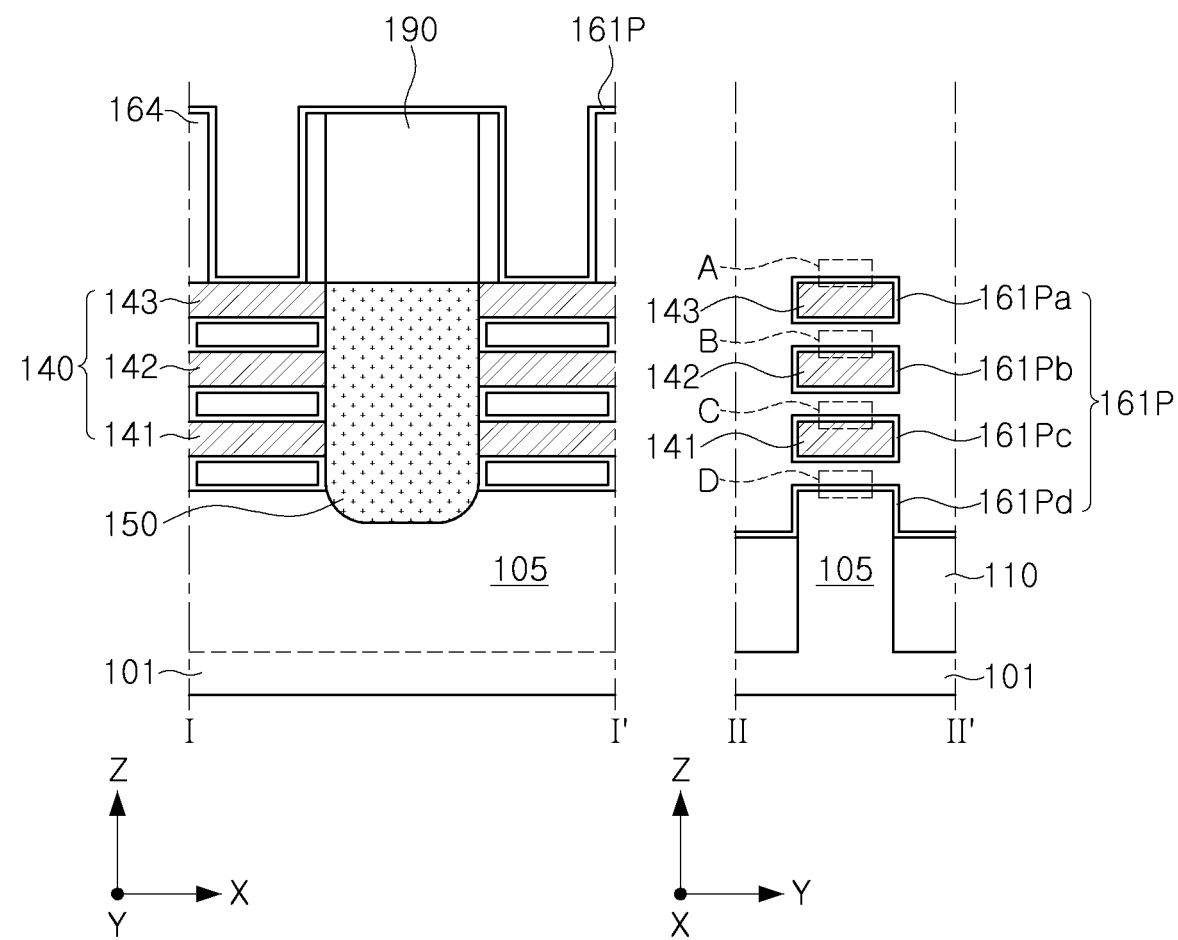
Figure 18B:
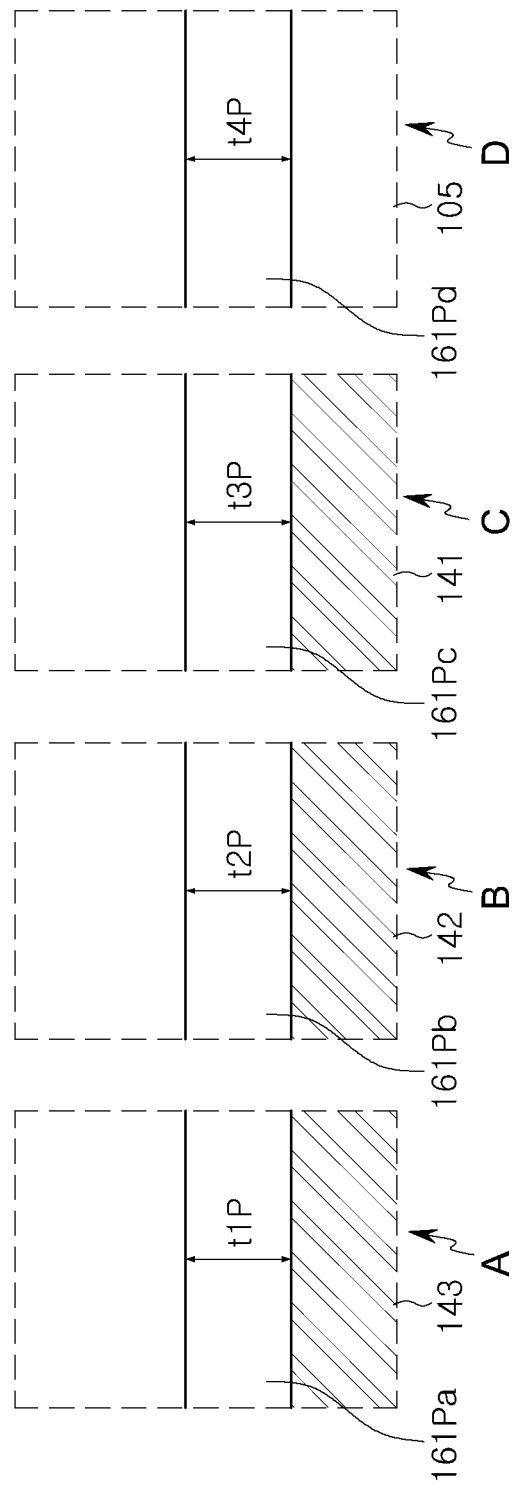

Referring to FIGS. 18A and 18B, preliminary gate dielectric layers 161P may be formed in the upper gap regions UR and the lower gap regions LR.

The preliminary gate dielectric layers 161P may be formed to conformally cover inner surfaces of the upper gap regions UR and the lower gap regions LR. As illustrated in FIG. 18B, the preliminary gate dielectric layers 161P may include a first portion 161Pc surrounding the first channel layer 141 in the Y direction, a second portion 161Pb surrounding the second channel layer 142 in the Y direction, a third portion 161Pa surrounding the third channel layer 143 in the Y direction, and a fourth portion 161Pd disposed on the active region 105. Thicknesses t3P, t2P, t1P, and t4P of the first to fourth portions 161Pc, 161Pb, 161Pa, and 161Pd of the preliminary gate dielectric layers 161P, respectively, may be substantially the same as each other.

The preliminary gate dielectric layers 161P may include or may be formed of at least one of oxide, nitride, and a high-k material. For example, the preliminary gate dielectric layers 161P may include or may be formed of at least one of, for example, silicon oxide ($SiO_2$), aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

According to an example embodiment, the preliminary gate dielectric layers 161P may be formed as a plurality of layers.

Figure 19A:
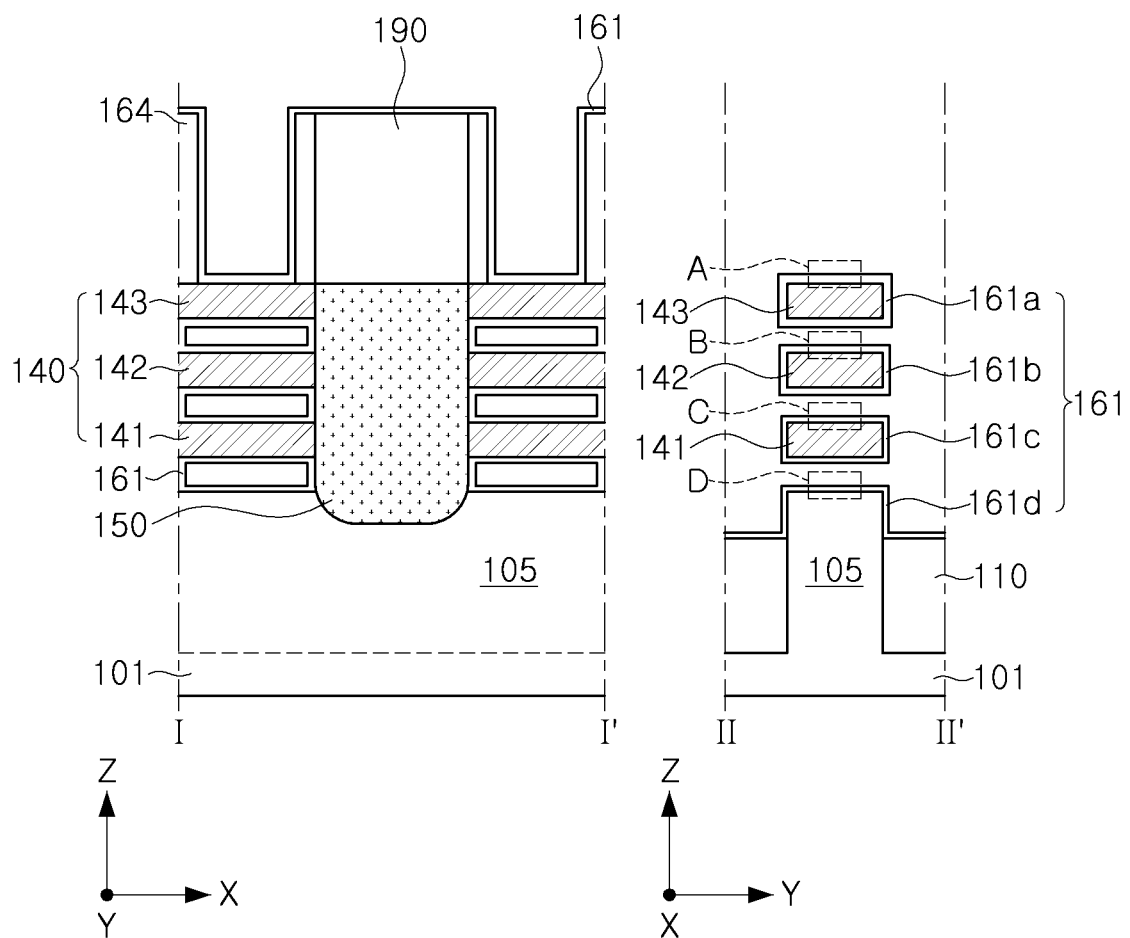
Figure 19B:
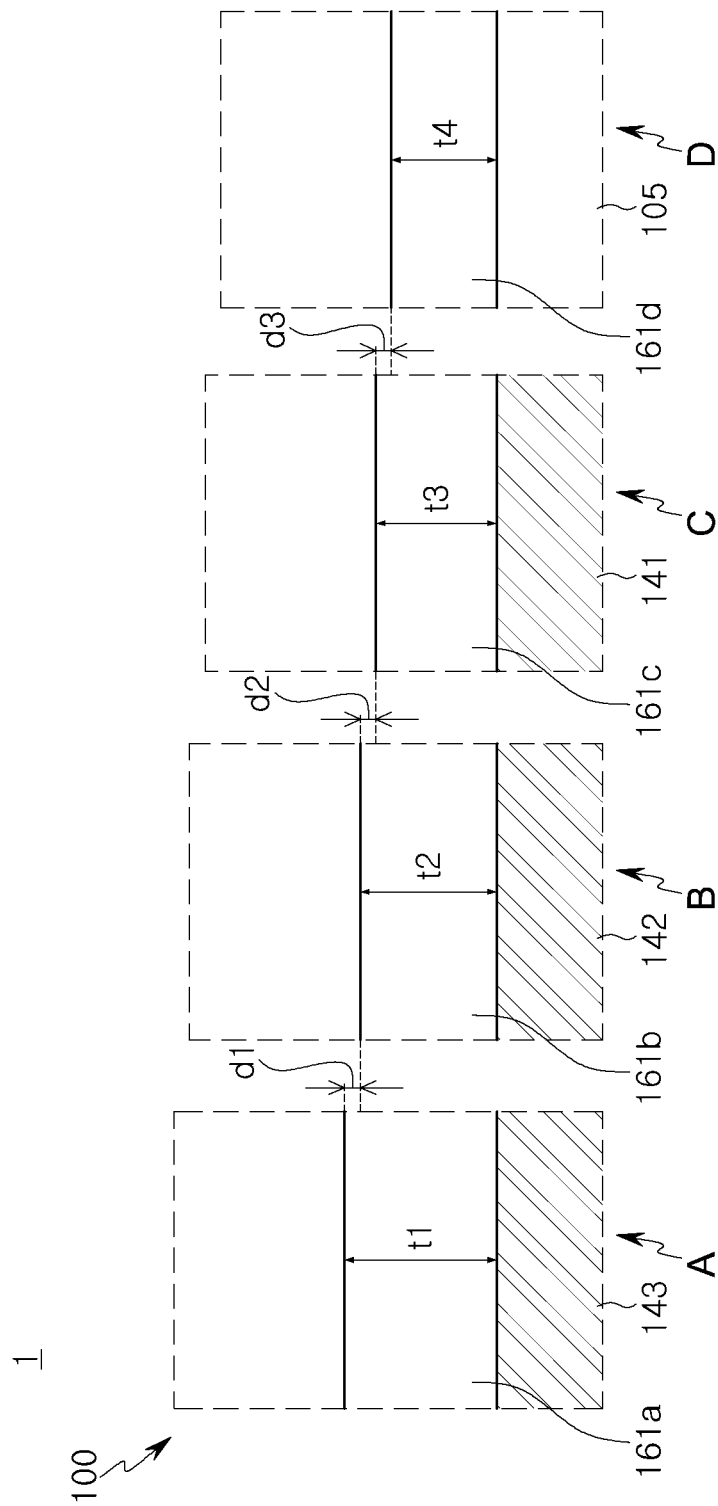

Referring to FIGS. 19A and 19B, a gate dielectric layer 161 may be formed by forming the preliminary gate dielectric layer 161P to be thicker as the preliminary gate dielectric layer 161P is disposed farther from the substrate 101.

After the conformally deposited preliminary gate dielectric layer 161P is formed, a process of inducing regrowth of a material included in the preliminary gate dielectric layer 161P may be performed. In an example embodiment, a wet etching process or an ozone ($O_3$) treatment process may be performed on the preliminary gate dielectric layer 161P. In an example embodiment, when the preliminary gate dielectric layer 161P includes or is formed of oxide, a process of supplying hydrogen peroxide ($H_2O_2$) or ozone ($O_3$), such as a wet etching process and an ozone ($O_3$) treatment process, may be performed to regrow the preliminary gate dielectric layer 161P.

When the preliminary gate dielectric layer 161P is regrown, the regrowth of the preliminary gate dielectric layer 161P in a portion distant from the substrate 101 in a vertical direction may be more actively performed, and the thickness t1 of the third portion 161a of the gate dielectric layer 161 disposed on a relatively high level may thus be the greatest.

The regrowth of the preliminary gate dielectric layer 161P in a portion disposed close to the substrate 101 in the vertical direction may be less performed, and the thickness t4 of the fourth portion 161d of the gate dielectric layer 161 disposed on a relatively low level may thus be the lowest.

The gate dielectric layer 161 may have a thickness that becomes greater as it is disposed more distant from the substrate 101. For example, the thickness t1 of the third portion 161a of the gate dielectric layer 161 may be greater than the thickness t2 of the second portion 161b of the gate dielectric layer 161, and the thickness t2 of the second portion 161b of the gate dielectric layer 161 may be greater than the thickness t3 of the first portion 161c of the gate dielectric layer 161.

In this case, a difference d1 between the thickness t1 of the third portion 161a of the gate dielectric layer 161 and the thickness t2 of the second portion 161b of the gate dielectric layer 161 may be in the range of from about 1 Å to about 3 Å. A difference d2 between the thickness t2 of the second portion 161b of the gate dielectric layer 161 and the thickness t3 of the first portion 161c of the gate dielectric layer 161 may be in the range of from about 1 Å to about 3 Å. A difference d3 between the thickness t3 of the first portion 161c of the gate dielectric layer 161 and the thickness t4 of the fourth portion 161d of the gate dielectric layer 161 may be in the range of from about 1 Å to about 3 Å. In some embodiments, the difference d1 may be greater than the other differences d2 and d3, and the difference d2 may be greater than the difference d3 due to the regrowth rate of the preliminary gate dielectric layer 161P increasing away from the active region 105. For example, the differences d1, d2, and d3 may be about 3 Å, about 2 Å, and about 1 Å, respectively. In some embodiments, the differences d1, d2, and d3 may be substantially the same as each other.

Figure 20:
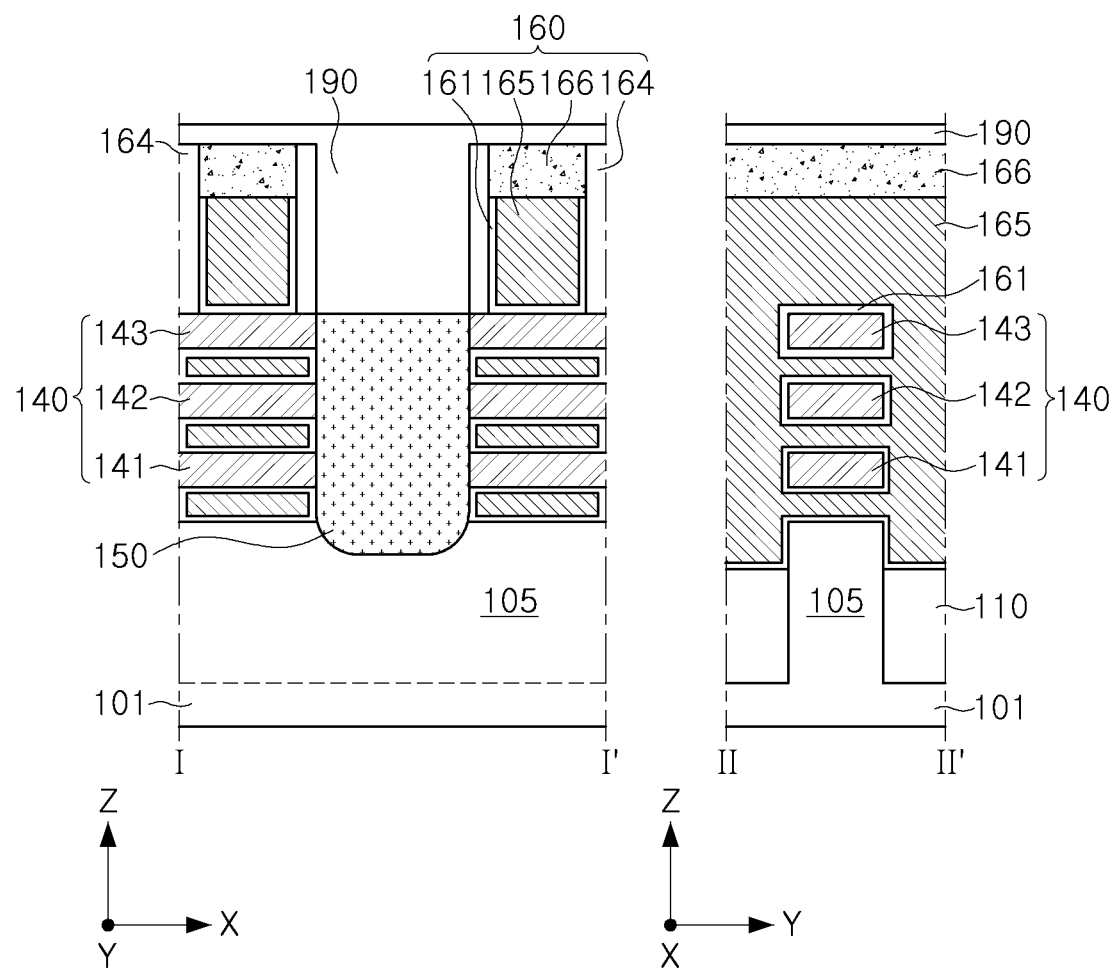

Referring to FIG. 20, a gate structure 160 including a gate electrode 165 may be formed on the gate dielectric layer 161.

The gate electrodes 165 may be formed to completely fill the upper gap regions UR and the lower gap regions LR of FIG. 17, and then may be partially removed at a predetermined depth from the top in the upper gap regions UR. Gate capping layers 166 may be formed in a region in which the gate electrodes 165 are removed in the upper gap regions UR. Therefore, gate structures 160 including the gate dielectric layer 162, the gate electrode 165, the spacer layers 164, and the gate capping layer 166 may be formed. Thereafter, an interlayer insulating layer 190 may be additionally formed.

Figure 21:
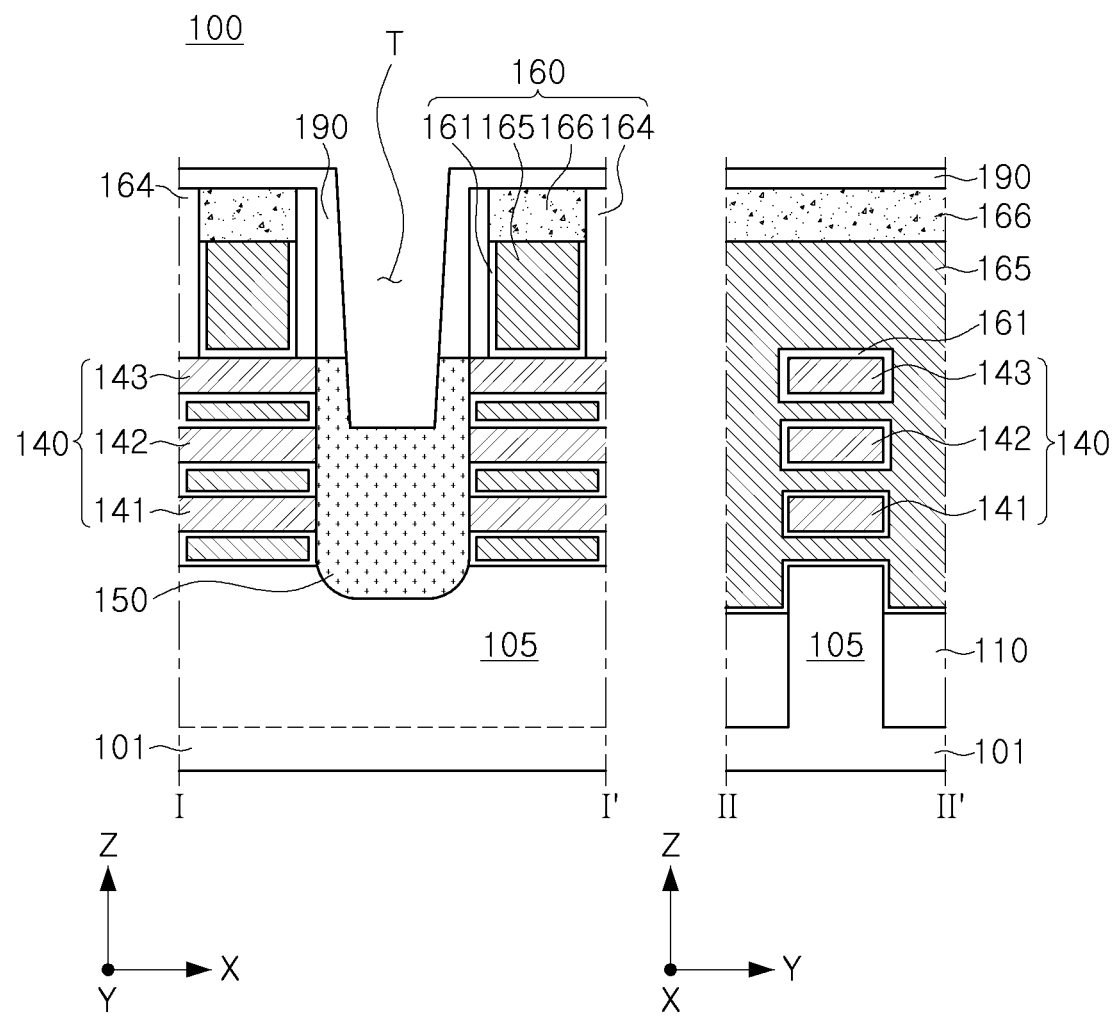

Referring to FIG. 21, a contact trench T passing through the interlayer insulating layer 190 may be formed between the gate structures 160.

The contact trench T may be formed by patterning the interlayer insulating layer 190. The contact trench T may partially extend into the source/drain regions 150 to form a recess region in the source/drain regions 150.

Next, referring to FIG. 2, a contact structure 180 may be formed by filling the contact trench T with a conductive material. For example, a metal nitride such as titanium nitride (TiN), tantalum nitride (TaN), and tungsten nitride (WN), or metal such as aluminum (Al), tungsten (W), and molybdenum (Mo) may be filled in the contact trench T. In example embodiments, a barrier metal layer disposed along an outer side surface of the contact trench T or a metal-semiconductor compound layer disposed in a region in contact with the first source/drain regions 150 may be further formed. The metal-semiconductor compound layer may be, for example, a metal silicide layer.

Thereafter, circuit wirings electrically connected to the gate electrode 165 and the contact structure 180 may be formed on the interlayer insulating layer 190.

A semiconductor device having improved electrical characteristics by making thicknesses according to positions of a gate dielectric layer surrounding each of a plurality of channel layers different from each other to reduce a difference in performance between the plurality of channel layers due to a subsequent process step after the gate dielectric layer is formed may be provided.

The present inventive concept is not limited by the example embodiments described above and the accompanying drawings, but is intended to be limited by the appended claims. Therefore, various types of substitutions, modifications, and alterations may be made by those skilled in the art without departing from the spirit of the present inventive concept as defined by the appended claims, and these substitutions, modifications, and alterations are to be fall within the scope of the present inventive concept.

What is claimed is:

1. A semiconductor device comprising:
    a first active region extending on a substrate in a first direction;
    a first channel structure including a plurality of channel layers disposed on the first active region to be spaced apart from each other in a vertical direction perpendicular to an upper surface of the substrate;
    a first gate structure disposed on the first active region, the first gate structure extending on the substrate in a second direction different from the first direction, and surrounding each of the plurality of channel layers of the first channel structure; and
    a first source/drain region disposed on the first active region on at least one side of the first gate structure and in contact with each of the plurality of channel layers,
    wherein the plurality of channel layers of the first channel structure include a first channel layer, a second channel layer on the first channel layer, and a third channel layer on the second channel layer,
    wherein the first gate structure includes a first gate electrode and a first gate dielectric layer,
    wherein the first gate dielectric layer includes a first portion surrounding the first channel layer, a second portion surrounding the second channel layer, and a third portion surrounding the third channel layer, and
    wherein the second portion has a second thickness greater than a first thickness of the first portion,
    wherein the third portion has a third thickness greater than the second thickness of the second portion, and
    wherein the first thickness of the first portion, the second thickness of the second portion, and the third thickness of the third portion are measured from an upper surface of the first channel layer, an upper surface of the second channel layer, and an upper surface of the third channel layer, respectively, in the vertical direction.

2. The semiconductor device of claim 1, wherein the first gate dielectric layer includes an interface layer and a high-k dielectric layer disposed on the interface layer.

3. The semiconductor device of claim 2, wherein in the first gate dielectric layer, an interface layer of the second portion has a thickness greater than a thickness of an interface layer of the first portion, and an interface layer of the third portion has a thickness greater than the thickness of the interface layer of the second portion.

4. The semiconductor device of claim 2, wherein in the first gate dielectric layer, a high-k dielectric layer of the second portion has a thickness greater than a thickness of a high-k dielectric layer of the first portion, and a high-k layer of the third portion has a thickness greater than the thickness of the high-k layer of the second portion.

5. The semiconductor device of claim 2, wherein the high-k dielectric layer is formed of a plurality of layers which are different from each other in material.

6. The semiconductor device of claim 1, wherein a difference between the first thickness of the first portion of the first gate dielectric layer and the second thickness of the second portion of the first gate dielectric layer is in a range of from about 1 Å to about 3 Å.

7. The semiconductor device of claim 1, wherein a difference between the first thickness of the first portion of the first gate dielectric layer and the third thickness of the third portion of the first gate dielectric layer is in a range of from about 2 Å to about 6 Å.

8. The semiconductor device of claim 1, further comprising:
    a second active region extending in the first direction on the substrate;
    a second channel structure including a plurality of channel layers disposed on the second active region to be spaced apart from each other in the vertical direction perpendicular to the upper surface of the substrate;

a second gate structure disposed on the second active region, the second gate structure extending on the substrate in the second direction, and surrounding each of the plurality of channel layers of the second channel structure; and a second source/drain region disposed on the second active region on at least one side of the second gate structure and in contact with the plurality of channel layers of the second channel structure, wherein the plurality of channel layers of the second channel structure include a fourth channel layer, a fifth channel layer on the fourth channel layer, and a sixth channel layer on the fifth channel layer, wherein the second gate structure includes a second gate electrode and a second gate dielectric layer, and wherein the second gate dielectric layer includes a first portion surrounding the fourth channel layer, a second portion surrounding the fifth channel layer, and a third portion surrounding the sixth channel layer.

9. The semiconductor device of claim 8, wherein a thickness of the first portion of the second gate dielectric layer and a thickness of the second portion of the second gate dielectric layer are substantially the same as each other.

10. The semiconductor device of claim 9, wherein the thickness of the second portion of the second gate dielectric layer and a thickness of the third portion of the second gate dielectric layer are substantially the same as each other.

11. The semiconductor device of claim 9, wherein the third portion of the second gate dielectric layer has a thickness greater than a thickness of the second portion of the second gate dielectric layer.

12. The semiconductor device of claim 8, wherein the first source/drain region includes a first conductivity-type semiconductor layer doped with a first dopant, and wherein the second source/drain region includes a second conductivity-type semiconductor layer doped with a second dopant different from the first dopant.

13. The semiconductor device of claim 8, wherein the first gate electrode includes a first work function control pattern, wherein the second gate electrode includes a second work function control pattern including a material different from a material of the first work function control pattern, and wherein the second portion of the second gate dielectric layer has a thickness greater than a thickness of the first portion of the second gate dielectric layer, and wherein the third portion of the second gate dielectric layer has a thickness greater than the thickness of the second portion of the second gate dielectric layer.

14. The semiconductor device of claim 13, wherein a difference between the thickness of the third portion of the second gate dielectric layer and the thickness of the first portion of the second gate dielectric layer is greater than a difference between the thickness of the third portion of the first gate dielectric layer and the thickness of the first portion of the first gate dielectric layer.

15. A semiconductor device comprising:
an active region extending on a substrate in a first direction;

a plurality of channel layers disposed on the active region to be spaced apart from each other in a direction perpendicular to an upper surface of the substrate;

a plurality of gate structures disposed on the active region and spaced apart from each other in the first direction, the plurality of gate structures extending in a second direction on the substrate and including a first gate structure surrounding each of the plurality of channel layers; and a source/drain region disposed on the active region on at least one side of the gate structures and in contact with the plurality of channel layers, wherein the plurality of channel layers include a first channel layer, a second channel layer on the first channel layer, and a third channel layer on the second channel layer, wherein the first gate structure includes a gate electrode and a gate dielectric layer, wherein the gate dielectric layer includes a first portion surrounding the first channel layer, a second portion surrounding the second channel layer, a third portion surrounding the third channel layer, and a fourth portion disposed between the active region and the gate electrode, wherein the first, the second, the third, and the fourth portions of the gate dielectric layer have different thicknesses from each other, wherein the third portion of the gate dielectric layer has the greatest thickness among the first, the second, the third, and the fourth portions of the gate dielectric layer, wherein a first thickness of the first portion, a second thickness of the second portion, and a third thickness of the third portion are measured from an upper surface of the first channel layer, an upper surface of the second channel layer, and an upper surface of the third channel layer, respectively, in a vertical direction perpendicular to an upper surface of the active region, and wherein a fourth thickness of the fourth portion is measured from the upper surface of the active region in the vertical direction.

16. The semiconductor device of claim 15, wherein a difference between the first thickness of the first portion of the gate dielectric layer and the second thickness of the second portion of the gate dielectric layer is in a range of from about 1 Å to about 3 Å, and wherein a difference between the second thickness of the second portion of the gate dielectric layer and the third thickness of the third portion of the gate dielectric layer is in a range of from about 1 Å to about 3 Å.

17. A semiconductor device comprising:
an active region extending on a substrate in a first direction;

a plurality of channel layers disposed on the active region to be spaced apart from each other in a direction perpendicular to an upper surface of the substrate;

a plurality of gate structures disposed on the active region and spaced apart from each other in the first direction, the plurality of gate structures extending in a second direction on the substrate and including a first gate structure surrounding each of the plurality of channel layers; and a source/drain region disposed on the active region on at least one side of the gate structures and in contact with the plurality of channel layers, wherein the plurality of channel layers include a first channel layer, a second channel layer on the first channel layer, and a third channel layer on the second channel layer, wherein the first gate structure includes a gate electrode and a gate dielectric layer, wherein the gate dielectric layer includes a first portion surrounding the first channel layer, a second portion surrounding the second channel layer, a third portion surrounding the third channel layer, and a fourth portion disposed between the active region and the gate electrode, wherein the fourth portion of the gate dielectric layer has the smallest thickness among the first, the second, the third, and the fourth portions of the gate dielectric layer, wherein a first thickness of the first portion, a second thickness of the second portion, and a third thickness of the third portion are measured from an upper surface of the first channel layer, an upper surface of the second channel layer, and an upper surface of the third channel layer, respectively, in a vertical direction perpendicular to an upper surface of the active region, and wherein a fourth thickness of the fourth portion is measured from the upper surface of the active region in the vertical direction.

18. The semiconductor device of claim 17,
wherein the third portion of the gate dielectric layer has the greatest thickness among the first, the second, the third, and the fourth portions of the gate dielectric layer.

19. The semiconductor device of claim 17,
wherein the gate dielectric layer includes an interface layer and a high-k dielectric layer disposed on the interface layer, and
wherein an interface layer of the second portion has a thickness greater than a thickness of an interface layer of the first portion, and an interface layer of the third portion has a thickness greater than the thickness of the interface layer of the second portion.

20. The semiconductor device of claim 17,
wherein the second portion of the gate dielectric layer has the second thickness greater than the first thickness of the first portion of the gate dielectric layer, and
wherein the third portion of the gate dielectric layer has the third thickness greater than the second thickness of the second portion of the gate dielectric layer.

* * * * *